United States Patent
Xu et al.

(10) Patent No.: US 11,677,031 B2
(45) Date of Patent: Jun. 13, 2023

(54) OXIDE SEMICONDUCTOR THIN-FILM AND THIN-FILM TRANSISTOR CONSISTED THEREOF

(71) Applicant: SOUTH CHINA UNIVERSITY OF TECHNOLOGY, Guangzhou (CN)

(72) Inventors: Miao Xu, Guangzhou (CN); Hua Xu, Guangzhou (CN); Weijing Wu, Guangzhou (CN); Weifeng Chen, Guangzhou (CN); Lei Wang, Guangzhou (CN); Junbiao Peng, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 16/529,833

(22) Filed: Aug. 2, 2019

(65) Prior Publication Data

US 2020/0027993 A1    Jan. 23, 2020

Related U.S. Application Data

(63) Continuation of application No. PCT/CN2017/111109, filed on Nov. 15, 2017.

(30) Foreign Application Priority Data

Apr. 10, 2017  (CN) .......................... 201710229199.9

(51) Int. Cl.
*H01L 29/78* (2006.01)
*H01L 29/786* (2006.01)
(Continued)

(52) U.S. Cl.
CPC .. *H01L 29/78693* (2013.01); *H01L 21/02266* (2013.01); *H01L 21/02581* (2013.01); *H01L 21/30604* (2013.01)

(58) Field of Classification Search
CPC ......... H01L 29/78693; H01L 21/02266; H01L 21/02581; H01L 21/30604
(Continued)

(56) References Cited

U.S. PATENT DOCUMENTS 5,686,557 A * 11/1997 Kiyohara ............... C08G 69/26
                                                         528/331
5,820,960 A * 10/1998 Kwon ................... G11B 5/7315
                                                         428/64.1
(Continued)

FOREIGN PATENT DOCUMENTS

CN        102832235 A  * 12/2012  ............. C23C 14/08
CN        102832235 A    12/2012
(Continued)

OTHER PUBLICATIONS

The role of rare earth oxides as promoters and stabilizers in combustion catalysts, Sara Colussi, Carla de Leitenburg, Giuliano Dolcetti, Alessandro Trovarelli*, Journal of Alloys and Compounds 374 (2004) 387-392 (Year: 2004).*

(Continued)

*Primary Examiner* — Sheikh Maruf
(74) *Attorney, Agent, or Firm* — Bayramoglu Law Offices LLC

(57) ABSTRACT

The present application discloses an oxide semiconductor thin-film and a thin-film transistor consisted thereof. The oxide semiconductor thin-film is fabricated by doping a certain amount of rare-earth oxide (RO) as light stabilizer to metal oxide (MO) semiconductor. The thin-film transistor comprising a gate electrode, a channel layer consisted by the oxide semiconductor thin-film, a source and drain electrode; the thin-film transistor employing etch-stop structure, a back-channel etch structure or a top-gate self-alignment structure.

19 Claims, 17 Drawing Sheets

(51) Int. Cl.
*H01L 21/02* (2006.01)
*H01L 21/306* (2006.01)

(58) Field of Classification Search
USPC .......................................................... 257/43
See application file for complete search history.

(56) References Cited

U.S. PATENT DOCUMENTS

| | | | | |
|---|---|---|---|---|
| 2003/0091842 | A1* | 5/2003 | Murakami | H05K 3/281 |
| | | | | 428/473.5 |
| 2003/0166796 | A1* | 9/2003 | Imaizumi | C08L 53/00 |
| | | | | 525/534 |
| 2006/0231882 | A1* | 10/2006 | Kim | H01L 21/02266 |
| | | | | 257/310 |
| 2007/0246867 | A1* | 10/2007 | Nelson | B29C 48/397 |
| | | | | 523/333 |
| 2008/0308796 | A1* | 12/2008 | Akimoto | H01L 21/02164 |
| | | | | 257/43 |
| 2009/0294764 | A1* | 12/2009 | Kim | H01L 29/78693 |
| | | | | 257/43 |
| 2010/0092800 | A1* | 4/2010 | Itagaki | C30B 25/183 |
| | | | | 428/697 |
| 2012/0012835 | A1* | 1/2012 | Herman | H01L 21/02581 |
| | | | | 257/43 |
| 2012/0049183 | A1* | 3/2012 | Yamazaki | H01L 27/1225 |
| | | | | 257/43 |
| 2012/0060750 | A1* | 3/2012 | Yamazaki | C23C 14/541 |
| | | | | 117/88 |
| 2012/0112183 | A1* | 5/2012 | Endo | H01L 21/02664 |
| | | | | 257/E29.296 |
| 2012/0161125 | A1* | 6/2012 | Yamazaki | H01L 27/1207 |
| | | | | 257/E21.409 |
| 2012/0175608 | A1* | 7/2012 | Yamazaki | H01L 27/1214 |
| | | | | 257/43 |
| 2012/0187395 | A1* | 7/2012 | Koezuka | H01L 29/7869 |
| | | | | 257/43 |
| 2012/0277352 | A1* | 11/2012 | Ni | C08K 5/34 |
| | | | | 977/773 |
| 2012/0286262 | A1* | 11/2012 | Koyama | H01L 27/127 |
| | | | | 257/43 |
| 2012/0315730 | A1* | 12/2012 | Koezuka | H01L 29/4908 |
| | | | | 438/158 |
| 2013/0009219 | A1* | 1/2013 | Yamazaki | H01L 29/786 |
| | | | | 257/288 |
| 2013/0069055 | A1* | 3/2013 | Yamazaki | H01L 29/78618 |
| | | | | 257/43 |
| 2013/0099232 | A1* | 4/2013 | Cho | H01L 29/513 |
| | | | | 257/43 |
| 2013/0105865 | A1* | 5/2013 | Honda | H01L 29/7869 |
| | | | | 257/255 |
| 2013/0126861 | A1* | 5/2013 | Tanaka | H01L 21/02189 |
| | | | | 257/43 |
| 2013/0126868 | A1* | 5/2013 | Yamazaki | H01L 29/7869 |
| | | | | 438/151 |
| 2013/0134415 | A1* | 5/2013 | Godo | H01L 29/66969 |
| | | | | 257/43 |
| 2013/0187153 | A1* | 7/2013 | Yamazaki | H01L 29/7869 |
| | | | | 257/43 |
| 2013/0320330 | A1* | 12/2013 | Yamazaki | H01L 29/78648 |
| | | | | 257/43 |
| 2014/0034946 | A1* | 2/2014 | Yamazaki | H01L 29/42356 |
| | | | | 257/43 |
| 2014/0061654 | A1* | 3/2014 | Yamazaki | H01L 27/0629 |
| | | | | 257/71 |
| 2014/0131700 | A1* | 5/2014 | Yamazaki | H01L 27/12 |
| | | | | 257/43 |
| 2014/0175433 | A1* | 6/2014 | Yamazaki | H01L 27/1259 |
| | | | | 257/43 |
| 2014/0175436 | A1* | 6/2014 | Yamazaki | H01L 27/1225 |
| | | | | 257/43 |
| 2014/0306217 | A1* | 10/2014 | Yamazaki | H01L 29/78696 |
| | | | | 257/43 |
| 2014/0333864 | A1* | 11/2014 | Miyake | H01L 27/1255 |
| | | | | 257/43 |
| 2015/0014679 | A1* | 1/2015 | Sasagawa | H01L 29/24 |
| | | | | 257/43 |
| 2015/0221774 | A1* | 8/2015 | Yamazaki | H01L 29/78618 |
| | | | | 257/43 |
| 2016/0118501 | A1* | 4/2016 | Nabatame | H01L 21/40 |
| | | | | 257/43 |
| 2017/0236943 | A1* | 8/2017 | Yamazaki | H01L 29/66969 |
| | | | | 257/43 |
| 2018/0047753 | A1* | 2/2018 | Yamazaki | H01L 27/0688 |
| 2019/0007998 | A1* | 1/2019 | Su | H05B 3/14 |
| 2020/0152796 | A1* | 5/2020 | Yamazaki | H01L 29/786 |
| 2021/0151606 | A1* | 5/2021 | Xu | H01L 21/02422 |

FOREIGN PATENT DOCUMENTS

CN 104218074 A 12/2014
CN 107146816 A 9/2017

OTHER PUBLICATIONS

Machine translation of CN-1730522-A is added.*
The role of rare earth oxides as promoters and stabilizers in combustion catalysts Sara Colussi, Carla de Leitenburg, Giuliano Dolcetti, Alessandro Trovarelli, year 2003.*
International Search Report issued in corresponding International application No. PCT/CN2017/111109, dated Jan. 24, 2018(4 pages).

* cited by examiner

OXIDE SEMICONDUCTOR THIN-FILM AND THIN-FILM TRANSISTOR CONSISTED THEREOF

CROSS-REFERENCE TO RELATED APPLICATIONS

This patent application is a continuation of International Application No. PCT/CN2017/111109, filed on Nov. 15, 2017, which is hereby incorporated by reference in its entirety.

TECHNICAL FIELD

The present application relates generally to semiconductor materials and devices technical field, more specifically relates to oxide semiconductor thin-film and thin-film transistor consisted thereof.

BACKGROUND

The technique of Thin Film Transistor (TFT) back panels is the critical technique of Flat Panel Display (FPD) industry Metal Oxide-TFTs (MO-TFT) doesn't only exhibit high mobility (between 1 to 100 $cm^2/(V·s)$ about) and large area unifomrity but also its preparation process is compatible with the present a-Si process, relatively simple and low cost.

It is widely known that as a critical part, the thin-film transistors will be inevitably under light irradiation when applied in the display. The currently developed oxide semiconductor thin-film trill produce corresponding sub-gap states in band gap because of the existence of oxygen vacancies. The sub-gap states will be excited and release electron hole pairs under irradiation with certain energy, which causes threshold voltage shift due to gate voltage, resulting in deterioration of display performance. Therefore, it is a crucial issue of the oxide semiconductor thin-film devices to realize excellent light-induced stability that negligible threshold voltage shift trill be found under light irradiation, which should be resolved in real application.

To date, there is one method could be employed to decrease oxygen vacancy concentration in the metal oxide semiconductor thin-film by doping a certain amount of material which has strong binding strength with oxygen, which may improve the light-induced stability of the device at some degree but also decrease the mobility of the device, at the same time. Meanwhile, it still faces great challenges before comes into real application. Light shield is another method could be employed to the thin-film transistors, which by introducing black matrixes at the fabricate process such as silicon-based process. However, it only improves the light-response characteristics at some degree but exhibits limited improvement under the continuous light irradiation combine with gate voltage, which will seriously restricted its application area. Moreover, the complexity of the fabricate process will be increased with the shield treatment and result in a cost up. There for, it is means very much real significance to improve the light-induced stability.

Also, it means extraordinary significances to develop an oxide semiconductor thin-film that exhibits excellent light-induced stability in oxide thin-film transistors industry.

SUMMARY

In order to overcome the deficiencies of the prior art, the first object of this present application is to provide an oxide semiconductor thin-film.

The second object of this present application is to provide a thin-film transistor which is fabricated by using the oxide semiconductor thin-film as channel layer material.

To achieve the objects, the present application provides the technical solutions as follows:

An oxide semiconductor thin-film characterizes in that the oxide semiconductor thin-film is fabricated from $(MO)_x(RO)_y$ semiconductor material by doping a certain amount of rare-earth oxide (RO) as light stabilizer to metal oxide (MO) semiconductor, in where, $0.8 \leq x < 1$, $0.0001 \leq y \leq 0.2$, $x+y=1$;

the M in the metal oxide semiconductor is one element selected from In, Zn, Ga, Sn, Si, Al, Mg, Zr, Hf or Ta, or any arbitrary combination of two or more;

the R in the rare-earth oxide is one element selected from. Pr, Tb, Dy, Yb, or any arbitrary combination of two or more.

Preferably, the M in metal oxide semiconductor is a combination of Zn with one or two elements selected from Sn, In and Ga.

Preferably, the metal oxide semiconductor is one selected indium-zinc-oxide, indium-gallium-zinc-oxide, indium-tin-zinc-oxide or tin-zinc-oxide.

Preferably, ingredient mole ratio of $InO_3:ZnO$ is 2:1 in the indium-zinc-oxide.

Preferably, ingredient mole ratio of $In_2O_3:Ga_2O_3:ZnO$ is 2:1:2 in the indium-gallium-zinc-oxide.

Preferably, ingredient mole ratio of $In_2O_3:SnO_2:ZnO$ is 1:1:1 in the indium-tin-zinc-oxide.

Preferably, ingredient mole ratio of $ZnO:SnO_2$ is 2:1 in the tin-zinc-oxide.

Preferably, the $(MO)_x(RO)_y$ semiconductor material is one selected from praseodymium-doped indium-zinc-oxide, terbium-doped indium-gallium-zinc-oxide, dysprosium-doped indium-tin-zinc-oxide, and ytterbium-doped tin-zinc-oxide.

Preferably, value of y is 0.01 to 0.2.

Preferably, the thin-film is fabricated by sputtering in Ar and $O_2$ mixture gas with oxygen volume ratio at 0.1 to 0.6.

Preferably, the thin-film is fabricated by sputtering in Ar and $O_2$ mixture gas with oxygen volume ratio at 0.2 to 0.3.

Preferably, the thin-film is fabricated by solution process.

A thin-film transistor comprising a channel layer which is consisted by an oxide semiconductor thin-film that is fabricated from $(MO)_x(RO)_y$ semiconductor material by doping a certain amount of rare-earth oxide (RO) as light stabilizer to metal oxide (MO) semiconductor, in where, $0.8 \leq x < 1$, $0.0001 \leq y \leq 0.2$, $x+y=1$;

the M in the metal oxide semiconductor is one element selected from In, Zn, Ga, Sn, Si, Al, Mg, Zr, Hf or Ta, or any arbitrary combination of two or more;

the R in the rare-earth oxide is one element selected from Pr, Tb, Dy, Yb. or any arbitrary combination of two or more.

Preferably, the thin-film transistor comprising: a substrate, a gate electrode, a gate insulator layer, the channel layer, a source and drain electrode; the thin-film transistor employing an etch-stop structure.

Preferably, the thin-film transistor comprising: a substrate, a gate electrode, a gate insulator layer, the channel layer, an etch-stop layer, a source and drain electrode; the thin-film transistor employing a back-channel etch structure.

Preferably, the source and drain electrode was patterned under etchant of hydrogen peroxide based etching solution or aluminic based etching solution.

Preferably, the thin-film transistor comprising: a substrate, a buffer layer, the channel layer, a gate insulator layer, a gate electrode, an interval layer, a source and drain electrode; the thin-film transistor employing a top-gate self-alignment structure.

Preferably the substrate is flexible substrate such as polyimide, polyethylene, naphthalate polyethylene terephthalate, polyethylene, polypropylene, polystyrene, polyethersulfone.

Compared to the prior art, the beneficial effects of the present application are as follows:

The oxide semiconductor thin-film in this present application exhibits excellent light-induced stability By doping rare-earth oxide to the metal oxide semiconductor, the rare-earth metal atom replaces the former metal atom, Which reduces the former M-M interaction and further causes a Shift of valence band maximums (VBMs) resulting band structure of metal oxide semiconductors shifts from direct band-gap to indirect band-gap. Under the irradiation of incident light, only if there is an interaction with the phonon, will the valence band electrons transit to conduction band to make a contribution to transport properties. There for, it could significantly decrease the photo-induced carriers by doping rare-earth oxide. It also means that the threshold voltage of the devices is nearly unchanged under the irradiation of incident light when compares with those ones without irradiation. Meanwhile, there is negligible effect on other performance parameters.

The addition quantity of rare-earth oxide is relatively low in the oxide semiconductor thin-film in this present application, which means it shows limited effects on performance parameters such as mobility of the base material, and it won't cause a degradation of fundamental performance of the device.

The oxide semiconductor thin-film in this present application exhibits excellent light-induced stability. In addition, its fabricate processes are relatively simple and compatible. It also shows obvious improvements when applied into various metal oxide base material.

DESCRIPTION OF EMBODIMENTS

Figure 1:
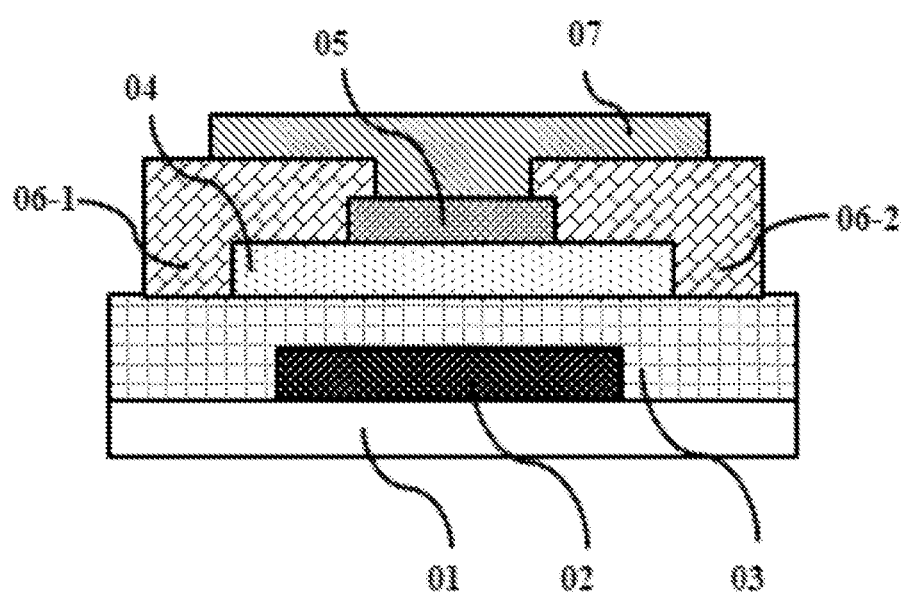
FIG. 1 is a schematic structural diagram of the thin-film transistor of example 1.

Embodiments of the present application are described in further detail.

The present, application will be described in further detail below with reference to the embodiments and the accompanying drawings. It should be understood that the specific embodiments described herein are merely illustrative of the application and are not intended to limit the invention. It should also be noted that, for the convenience of description, only some, but not all, of the information related to the invention are shown in the drawings.

Example 1

Example 1 presents an oxide semiconductor thin-film, the oxide semiconductor thin-film is made of Praseodymium-doped indium-zinc-oxide (Pr:IZO) semiconductor material which is fabricated by doping Praseodymium oxide as light stabilizer in indium-zinc-oxide.

Example 1 presents a thin-film transistor, which is an etch stop structure whose schematic structural diagram is Shown in FIG. 1, comprising: a substrate 01, a gate electrode 02 positioned on the substrate 01, a gate insulator layer 03 provided on the gate electrode 02 and the substrate 01, a channel layer 04, an etch-stop layer 05, a source and drain electrode 06-1/06-2 that separately electrical connects to two sides of the channel layer 04, a passivation layer 07;

The substrate 01 is made of glass and covered with silicon oxides buffer layer.

The gate electrode 02 is a Mo/Al/Mo layered structure with thickness of 50/200/50 nm to each layer, which is fabricated by magnetron sputtering of corresponding material subsequently;

The gate insulator layer 03 is a $Si_3N_4/SiO_2$ layered structure with thickness of 250/50 nm to each layer, which is fabricated by chemical vapor deposition (CVD). The $Si_3N_4$ layer electrical closes to the gate electrode 02 and the $SiO_2$ layer electrical faces to the channel layer 04.

In order to study the effects of praseodymium oxide concentration on the performance of device, the channel layer 04 is fabricated by co-sputtering of indium-zinc-oxide ceramic target (IZO) and praseodymium-doped indium-zinc-oxide (Pr:IZO) ceramic target; thin-films with different ratio are fabricated by regulating the power of each target.

In the indium-zinc-oxide (IZO) ceramic target, the ingredient mole ratio of $In_2O_3$:ZnO is 2:1, which marks as In(4)Zn(1). In the praseodymium-doped indium-zinc-oxide (Pr:IZO) ceramic target, the ingredient mole ratio of (praseodymium oxide):In(4)Zn(1) is 0.30:0.70, which means the value of x is 0.70 and y is 0.30 in the formula $(MO)_x(RO)_y$.

It should be noted that, all channel layers in the tests 1-10 in this present example are deposited to 20 nm thick in Ar and $O_2$ mixture gas in volume ratio 8:2 at 0.5 Pa on a room temperature substrate. The thin-films are annealed at 350° C. in air for 30 min before patterning. The chemical compositions of the thin-films are analyzed by X-ray photoelectron spectroscopy and transmission electron microscopy; portions at trace concentration are conjectured base on sputtering power.

Both the etch-stop layer 05 and the passivation layer 07 are 300 nm $SiO_2$ layer fabricated by CVD.

Both the source 06-1 and the drain 06-2 in the source and drain electrode are Mo/Al/Mo layered structure with thickness of 50/200/50 nm to each layer subsequently.

The thin-film transistor in this present example can be an enclosed structure consisting of the substrate, the gate electrode, the gate insulator layer, the channel layer, the etch-stop layer, the source and drain electrode and a passivation layer, or further comprising of a planarization layer, a reflective electrode, a pixel definite layer and so on, or even integrating with other devices.

The patterning process of the thin-films is carried on by lithography that combining with wet or dry etching.

Figure 2:
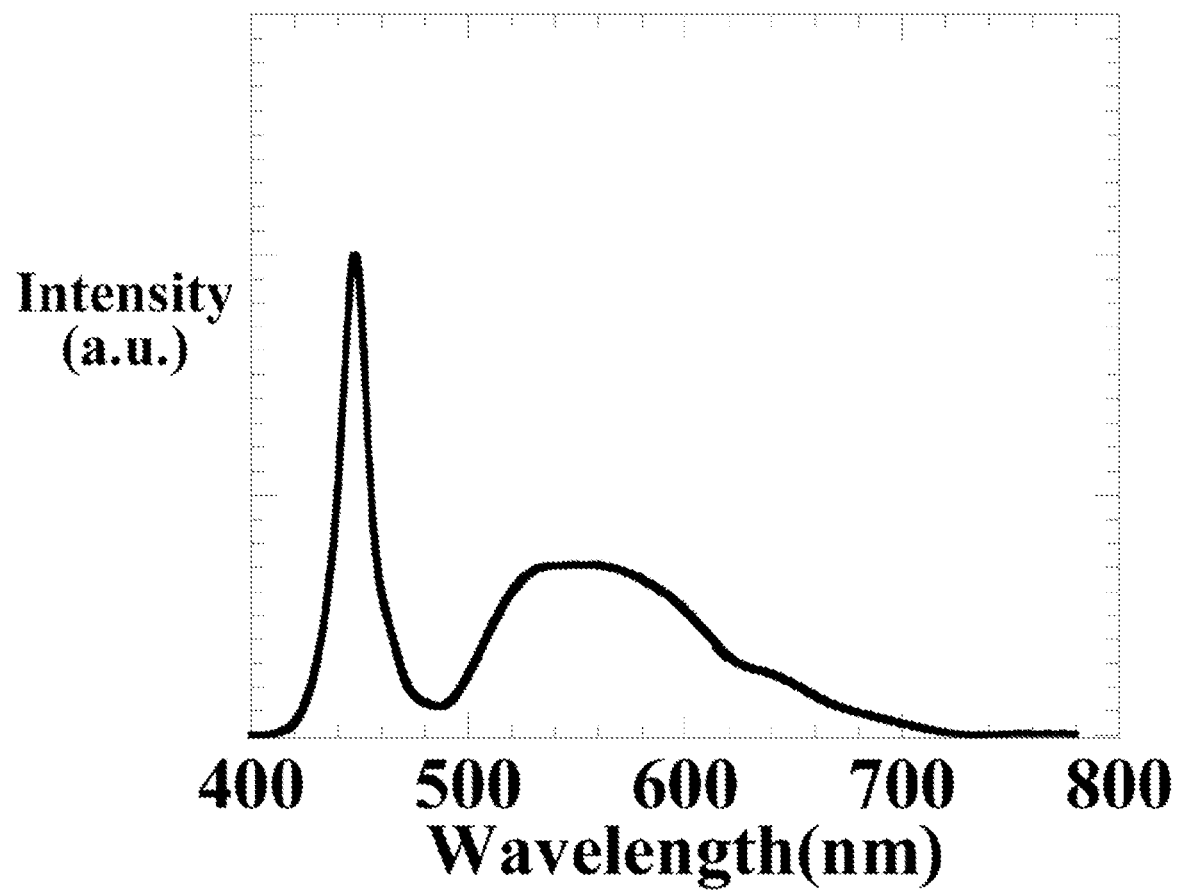
FIG. 2 is spectrogram of commercial available LED light source.

The detailed parameters of the thin-films as well as the performance of the thin-films transistors consisted thereof are shown in Table 1. The photo-current characteristics are characterized by irradiating the channel layer of the thin-film transistors devices using commercial available LED lights, whose spectrograms are shown in FIG. 2 with the intensities of 10000 nits. The threshold voltage shifts were calculated by evaluating the transfer characteristics under light irradiation and without, which are used to evaluate the strength of photo-current characteristics of the devices. The larger the threshold voltage shift the stronger the photo-current characteristics, or otherwise the weaker.

3(b) show the light-response curves of the thin-film transistors corresponding to the y to 0 and 0.024, respectively. As can be seen in FIG. 3, performance of the TFT devices without Pr doping degraded significantly under the LED illumination. However, the light-response is suppressed significantly with appropriate Pr doping, which means excellent light-induced stability and corresponds to weak photo-current characteristics in Table 1.

TABLE 1

| | test | 1 | 2 | 3 | 4 | 5 | 6 | 7 | 8 | 9 | 10 |
|---|---|---|---|---|---|---|---|---|---|---|---|
| InZnO | mole ratio of In:Zn | | | | | 4:1 | | | | | |
| Pr channel layer deposition | value of y | 0 | 0.0001 | 0.001 | 0.013 | 0.024 | 0.050 | 0.10 | 0.14 | 0.20 | 0.30 |
| | Deposition method | | | | | sputtering | | | | | |
| | $O_2/(Ar + O_2)(\%)$ | | | | | 20 | | | | | |
| | Sputtering pressure(Pa) | | | | | 0.5 | | | | | |
| | substrate temperature (° C.) | | | | | Room temperature | | | | | |
| channel layer treatment | Annealing | | | | | air-350° C. | | | | | |
| composition | Substrate | | | | | glass | | | | | |
| | Buffer layer | | | | | $SiO_2$ | | | | | |
| | Gate electrode | | | | | Mo/Al/Mo | | | | | |
| | Gate insulator layer | | | | | $SiO_2/Si_3N_4$ | | | | | |
| | Etch-stop layer | | | | | $SiO_2$ | | | | | |
| | Source and Drain electrode | | | | | Mo/Al/Mo | | | | | |
| | Passivation layer | | | | | $SiO_2$ | | | | | |
| Etch-stop layer treatment | Annealing | | | | | air-350° C. | | | | | |
| Performance | $V_{th}(V)$ [a] | −3.2 | −3.2 | −2.5 | −1.3 | −0.5 | −0.2 | 0.4 | 1.1 | 2.6 | 4.4 |
| | $\mu(cm^2V^{-1}s^{-1})$ [b] | 32.8 | 32.2 | 28.4 | 26.7 | 25.2 | 23.8 | 21.4 | 15.5 | 10.7 | 1.3 |
| | SS(V/decade) [c] | 0.12 | 0.13 | 0.19 | 0.21 | 0.25 | 0.26 | 0.29 | 0.31 | 0.38 | 0.46 |
| | $I_{on}/I_{off}$ | $10^9$ | $10^9$ | $10^9$ | $10^9$ | $10^9$ | $10^9$ | $10^9$ | $10^9$ | $10^8$ | $10^7$ |
| | Stability [d] | −− | − | + | ++ | ++ | ++ | ++ | ++ | ++ | ++ |
| | photo-current characteristics [e] | +++ | ++ | + | − | − | − | − | − | − | − |

Note:
[a] threshold voltage;
[b] mobility;
[c] sub-threshold swing;
[d] −−, poor; −, relatively poor; +, good; ++, excellent;
[e] +++, very strong; ++, strong; +, relatively strong; − weak.

As shown in Table 1, doping of Pr shows great effects on performance of the devices. Firstly, the devices without Pr doping (the value of y equal to 0) exhibits the highest mobility, lowest sub-threshold swing and negative threshold voltage but shows very strong photo-current characteristic, which means the devices will suffer large characteristics change under irradiation, such as negative threshold voltage shift and seriously degradation of sub-threshold swing. However, the photo-current characteristics of the devices are obviously suppressed by doping a certain amount of Praseodymium oxides.

Certainly, with the Pr concentration increasing the characteristics such as mobility will further degenerate and the photo-current characteristics will further improve. An excess Pr concentration such as value of y excess 0.30 could result an obvious degeneration in mobility, which will largely restrict the application of those devices even though they exhibit weak photo-current characteristics. Since that, a suitable doping quantity should be considered carefully to balance mobility against photo-current characteristics.

Figure 3A:
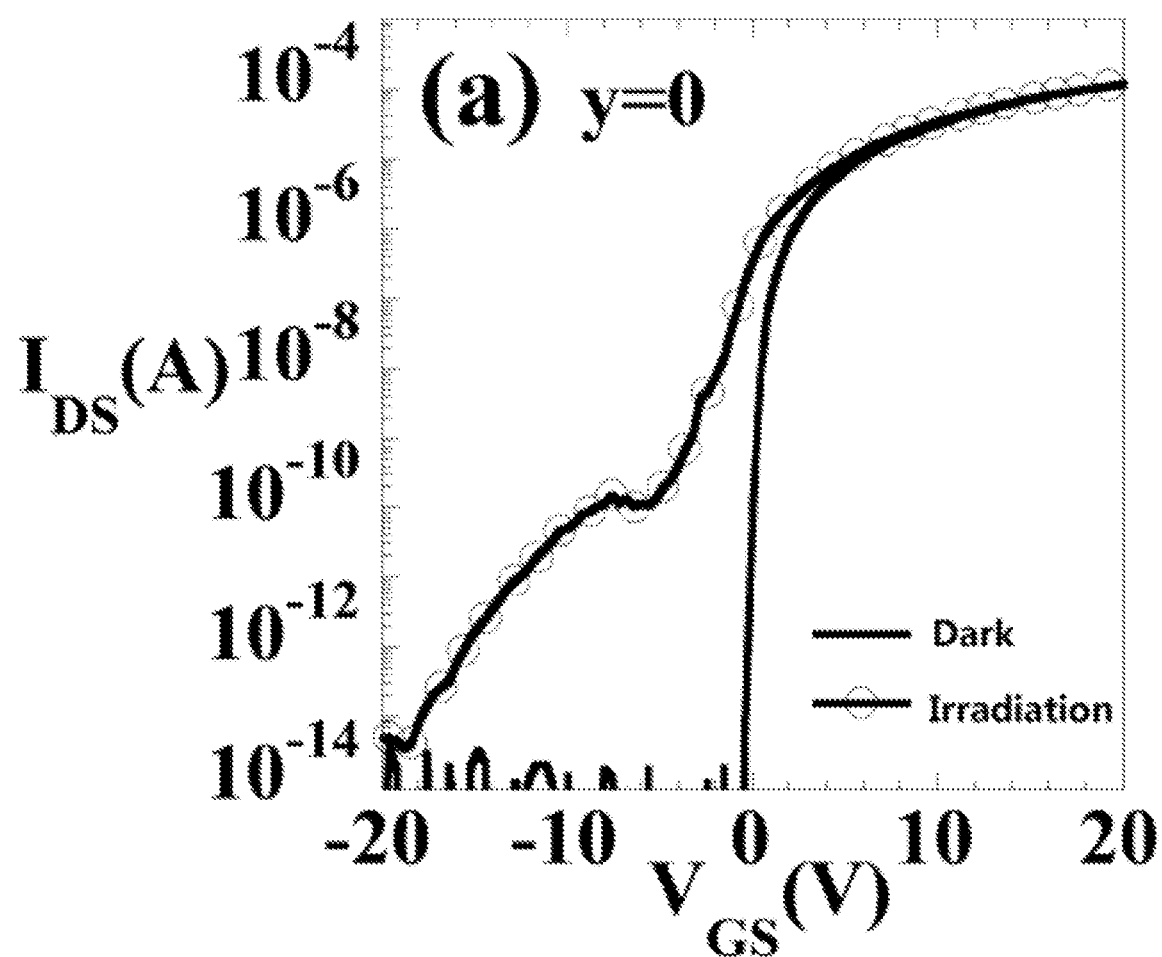
FIG. 3 is light-response curves of the thin-film transistor of example 1.
Figure 3B:
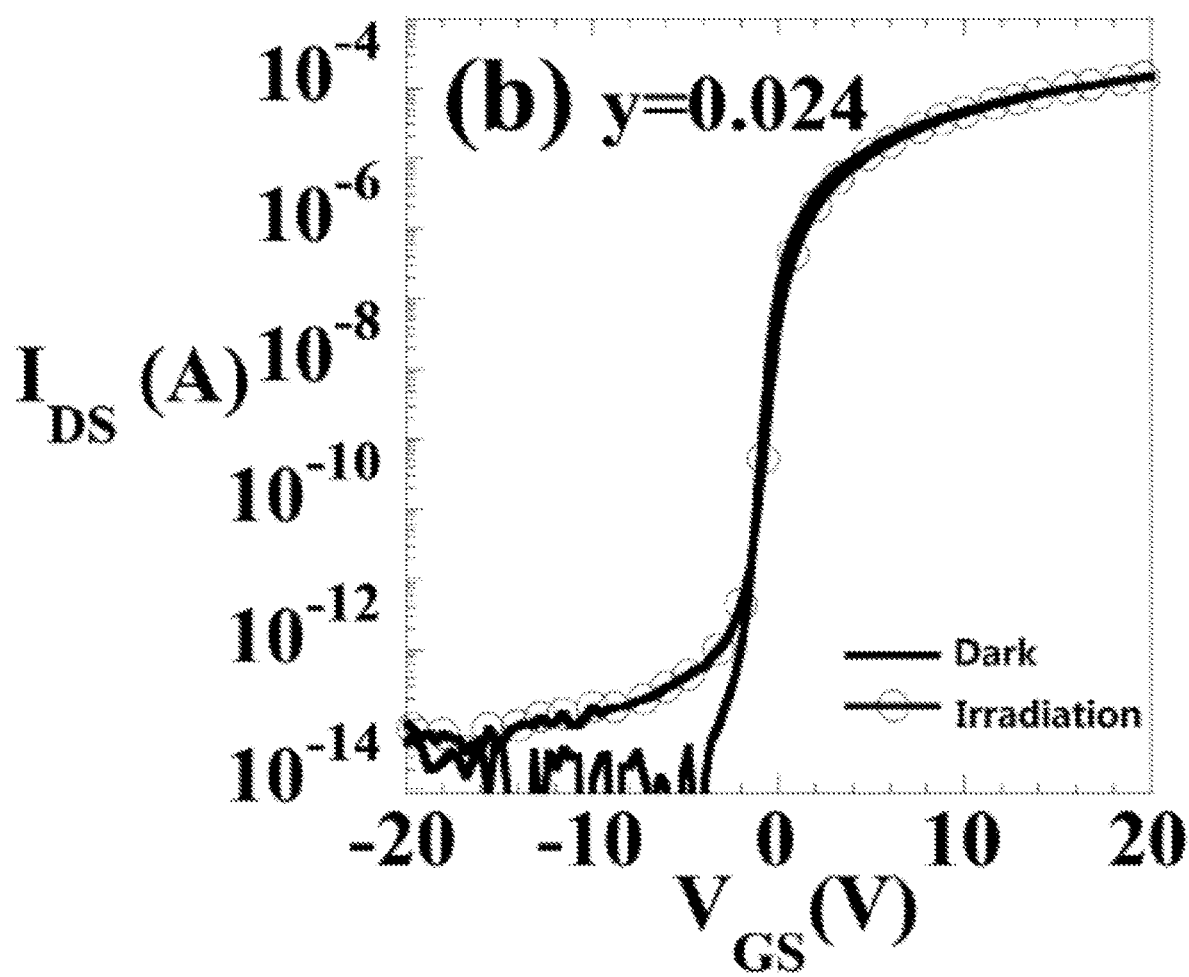

As an example, FIG. 3 shows light-response curves of the thin-film transistors in Example 1, the FIG. 3(a) and FIG.

Figure 4A:
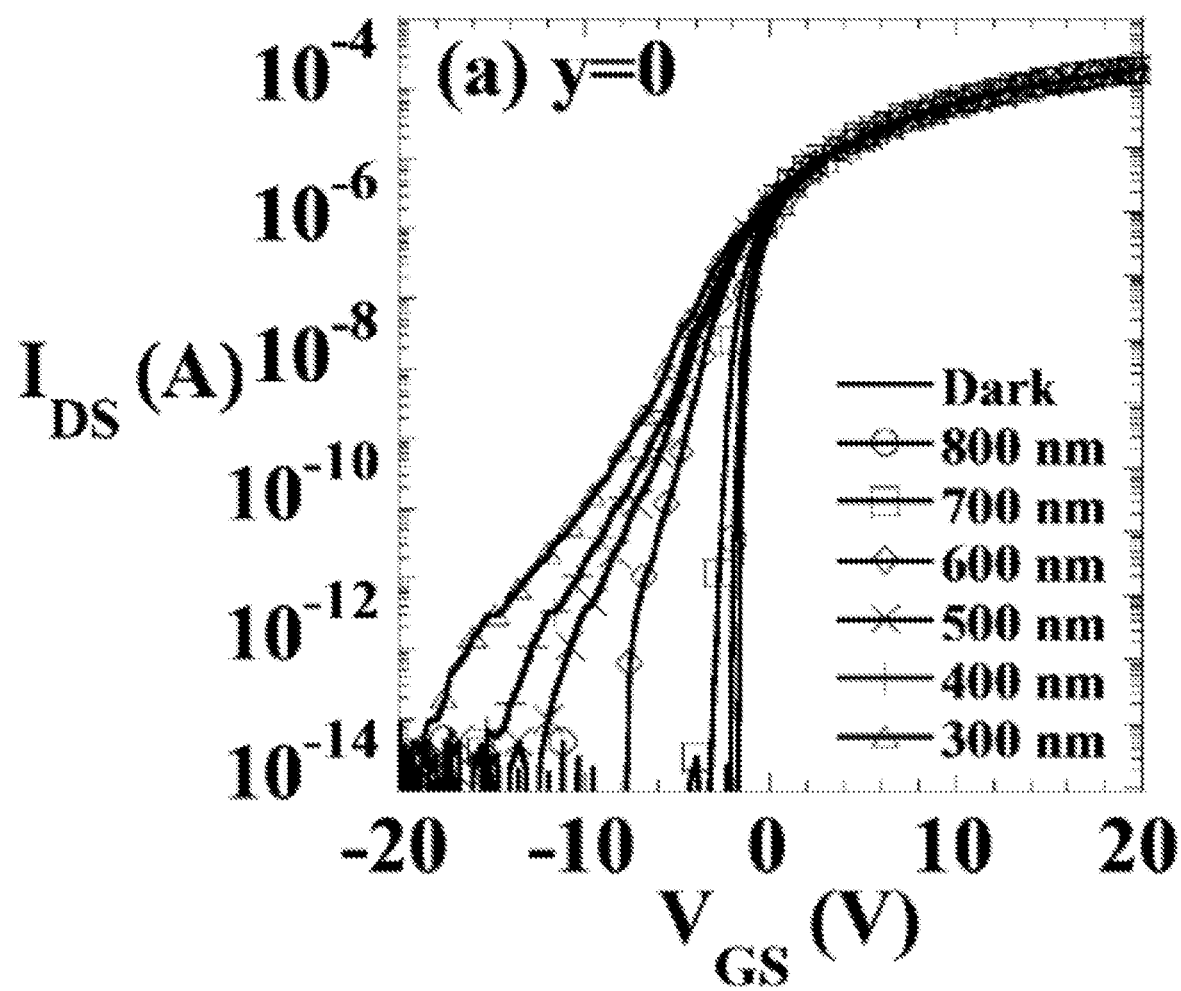
FIG. 4 is light-response curves of the thin-film transistors at gradient irradiating intensities of example 1.
Figure 4B:
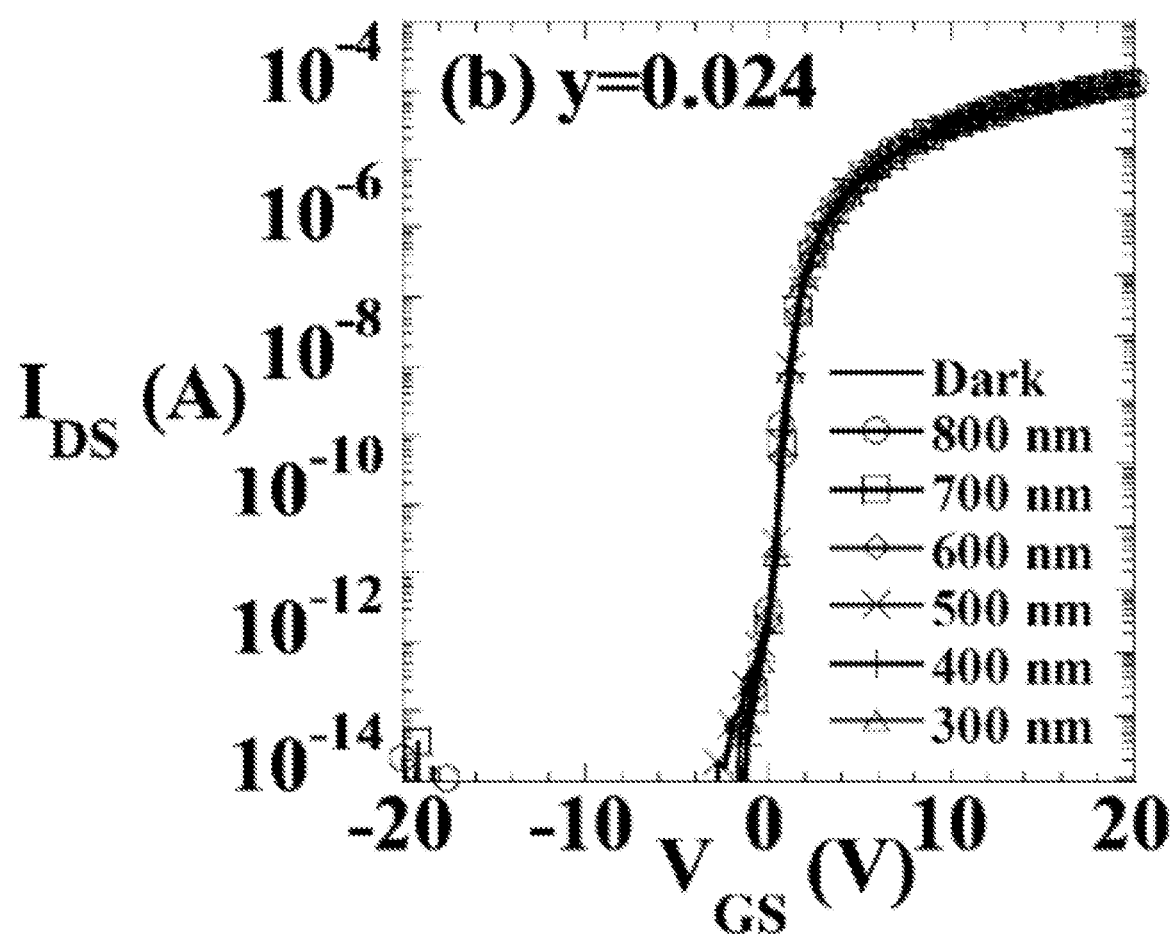

In addition, to further understand the light-response characteristics, the TFTs with various monochromatic light illumination was also investigated. FIG. 4 (a) and FIG. 4 (b) show the monochromatic light-response of the TFTs without and with Pr doping (y=0.024), respectively. As can be seen in FIG. 4, compared to the original dark condition, large photo current was found in TFT (y=0) illuminated by the light with wavelengths shorter than 500 inn causing serious degradation in the sub-threshold regime. As for the TFT with Pr doping (y=0.024), negligible degradation in the sub-threshold regime is found even with the wavelengths shorter than 300 nm, which exhibit excellent light-induced stability and corresponds to weak photo-current characteristics in Table 1.

The result of this example shows that it could improve the light-induced stability by doping a certain amount of praseodymium oxide into the indium-zinc-oxide base material.

It is worth to note that, with the increasing of the doping amount the devices show an obvious increase in sub-threshold swing, especially when employed to those base materials with lower carrier concentration. That probably means that there are new "traps" produced around Fermi level in the channel layer material. Based on the related Characterizations results to explain that, annihilation of photo-induced carriers seems to be the main factor to improve the photo-current characteristics of those materials.

Example 2

Example 2 presents an oxide semiconductor thin-film, the oxide semiconductor thin-film is made of terbium-doped indium-gallium-zinc-oxide (Tb:IGZO) semiconductor material which is fabricated by doping terbium oxide as light stabilizer in indium-gallium-zinc-oxide.

Figure 5:
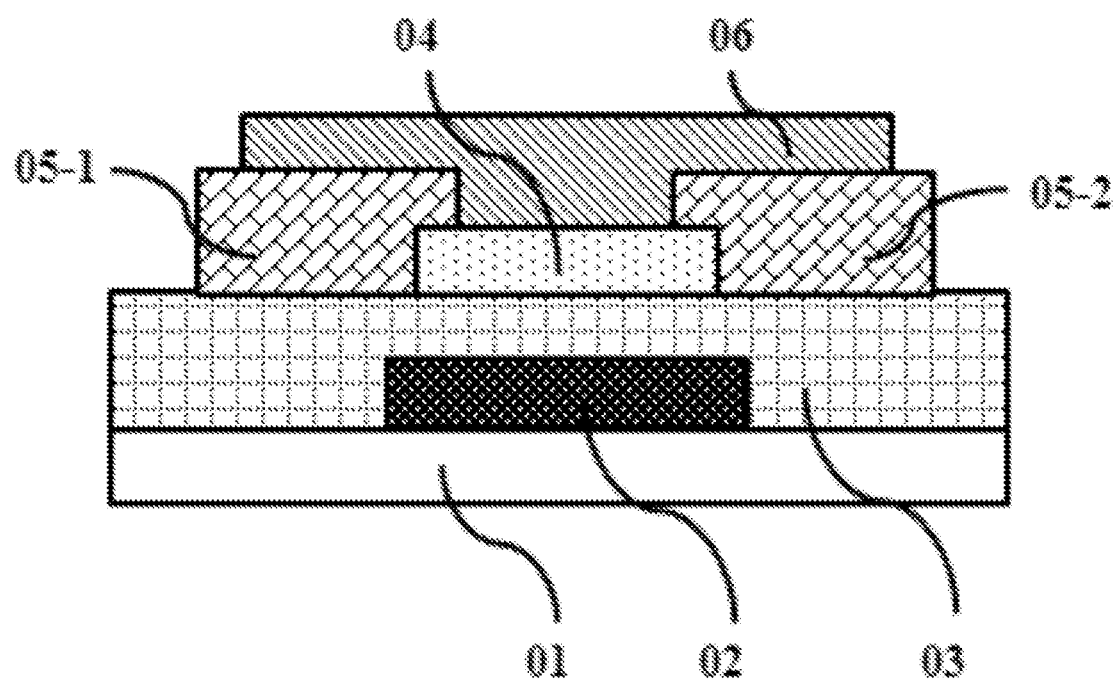
FIG. 5 is a schematic structural diagram of the thin-film transistor of example 2 and example 3.

Example 2 presents a thin-film transistor, which is a back-channel etch structure whose schematic structural diagram is shown as FIG. 5, comprising: a substrate 01, a gate electrode 02 positioned on the substrate 01, a gate insulator layer 03 positioned on the gate electrode 02 and the substrate 01, a channel layer 04, a source and drain electrode 05-01/05-2 that separately electrical connects to two sides of the channel layer 04, a passivation layer 06;

The substrate 01 is made of rigid alkaline-free glass and covered with silicon oxides buffer layer.

The gate electrode 02 is a Cu/Mo layered structure with thickness of 250/20 nm to each layer, which is fabricated by magnetron sputtering of corresponding material subsequently.

The gate insulator layer 03 is a $Si_3N_4/SiO_2$ layered structure with thickness of 250/50 run to each layer, which is fabricated by chemical vapor deposition (CVD). The $Si_3N_4$ layer electrical closes to the gate electrode 02 and the $SiO_2$ layer electrical faces to the channel layer 04.

In order to study the effects of terbium oxide concentration on the performance of device, the channel layer 04 is fabricated by co-sputtering of indium-gallium-zinc-oxide (IGZO) ceramic target and terbium-doped indium-gallium-zinc-oxide (Tb:IGZO) ceramic target; thin-films with different ratio are fabricated by regulating the power of each target.

In the indium-gallium-zinc-oxide (IGZO) ceramic target, the ingredient mole ratio of $In_2O_3:Ga_2O_3:ZnO$ is 2:1:2, which marks as In(2)Ga(1)Zn(1). In the terbium-doped indium-gallium-zinc-oxide (Tb:IGZO) ceramic target, the ingredient mole ratio of $Tb_2O_3:In(2)Ga(1)Zn(1)$ is 0.30:0.70, which means the value of x is 0.70 and y is 0.30 in the formula $(MO)_x(RO)_y$.

It should be noted that, all channel layers in the tests 1-10 in this present example are deposited to 40 nm thick in Ar and $O_2$ mixture gas in volume ratio 6:4 at 0.5 Pa on 200° C. substrates. The thin-films are annealed at 350° C. in air for 30 min before patterning. The chemical compositions of the thin-films are analyzed by X-ray photoelectron spectroscopy and transmission electron microscopy; portions with trace concentration are conjectured base on sputtering power.

The source 05-1 and the drain 05-2 in the source and drain electrode are both Cu/Mo layered structure with thickness of 250/20 nm to each layer subsequently. They are patterned under etching of commercial available hydrogen peroxide based etching solution, which shows negligible damage to the channel layer and without etching residual.

The passivation layer 06 is a 300 nm $SiO_2$ layer which is fabricated by CVD.

The thin-film transistor in this present example can be an enclosed structure consisting of the substrate, the gate electrode, the gate insulator layer, the channel layer, the source and drain electrode and a passivation layer, or further comprising of a planarization layer, a reflective electrode, a pixel definite layer and so on, or even integrating with other devices.

The patterning process of the thin-films is carried on by lithography that combining with wet or dry etching.

The detailed parameters of the thin-films as well as the performance of the thin-films transistors consisted thereof are shown in Table 2. The photo-current characteristics are characterized by irradiating the channel layer of the thin-film transistors devices using commercial available LED lights, whose spectrograms are shown as FIG. 2 and with the intensities of 10000 nits. The threshold voltage shifts were calculated by evaluating the transfer characteristics under light irradiation and without, which are used to evaluate the strength of photo-current characteristics of the devices. The larger the threshold voltage shift the stronger the photo-current characteristics, or otherwise the weaker.

TABLE 2

| | test | 1 | 2 | 3 | 4 | 5 | 6 | 7 | 8 | 9 | 10 |
|---|---|---|---|---|---|---|---|---|---|---|---|
| InGaZnO | mole ratio of In/Ga/Zn | | | | | 2:1:1 | | | | | |
| Tb | y | 0 | 0.0001 | 0.001 | 0.012 | 0.023 | 0.050 | 0.10 | 0.16 | 0.20 | 0.30 |
| Channel layer deposition | Deposition method | | | | | sputtering | | | | | |
| | $O_2/(Ar + O_2)(\%)$ | | | | | 40 | | | | | |
| | Sputtering pressure(Pa) | | | | | 0.5 | | | | | |
| | Substrate temperature(° C.) | | | | | 200 | | | | | |
| Channel layer treatment composition | Annealing | | | | | Air-350° C. | | | | | |
| | Substrate | | | | | alkaline-free glass | | | | | |
| | Gate electrode | | | | | Mo/Cu | | | | | |
| | Gate insulator layer | | | | | $SiO_2/Si_3N_4$ | | | | | |
| | Source and Drain electrode | | | | | Mo/Cu | | | | | |
| | Passivation layer | | | | | $SiO_2$ | | | | | |
| after passivation layer | Annealing | | | | | Air-350° C. | | | | | |
| Performance | $V_{th}(V)^{a)}$ | −2.4 | −2.2 | −1.5 | −1.0 | −0.3 | 0.6 | 1.4 | 2.1 | 3.4 | 5.6 |

TABLE 2-continued

| test | 1 | 2 | 3 | 4 | 5 | 6 | 7 | 8 | 9 | 10 |
|---|---|---|---|---|---|---|---|---|---|---|
| $\mu(cm^2V^{-1}s^{-1})$ [b] | 18.4 | 18.2 | 16.4 | 13.5 | 10.2 | 8.8 | 5.4 | 3.5 | 1.3 | 0.05 |
| SS(V/decade) [c] | 0.14 | 0.14 | 0.16 | 0.20 | 0.25 | 0.28 | 0.30 | 0.34 | 0.38 | 0.56 |
| $I_{on}/I_{off}$ | $10^9$ | $10^9$ | $10^9$ | $10^8$ | $10^8$ | $10^8$ | $10^8$ | $10^8$ | $10^7$ | $10^7$ |
| Stability [d] | − | − | + | ++ | ++ | ++ | ++ | ++ | ++ | ++ |
| Photo-current characteristics [e] | + | + | + | − | − | − | − | − | − | −− |

Note:
[a] threshold voltage;
[b] mobility;
[c] sub-threshold swing;
[d] −, relatively poor; +, good; ++, excellent;
[e] +, relatively strong; −, weak; −−, extremely weak.

As shown in Table 2, doping of Tb shows great effects on performance of the devices, Firstly, the device without Tb doping (the value of y equal to 0) exhibits the highest mobility, lowest sub-threshold swing and negative threshold voltage but show strong photo-current characteristic, which means the device will suffer large characteristics change under irradiation, such as negative threshold voltage shift and seriously degradation of sub-threshold swing. However, the photo-current characteristics of the devices are Obviously suppressed by doping a certain amount of terbium oxides. Certainly, with the Tb concentration increasing the characteristics such as mobility will further degenerate and photo-current characteristics will further decrease. An excess Tb concentration such as value of y excess 0.30 could result an obvious degeneration in mobility, which will largely restrict the application of those devices even though they exhibit very weak photo-current characteristics. Since that, a suitable doping quantity should be considered carefully to balance mobility against photo-current characteristics.

Figure 6A:
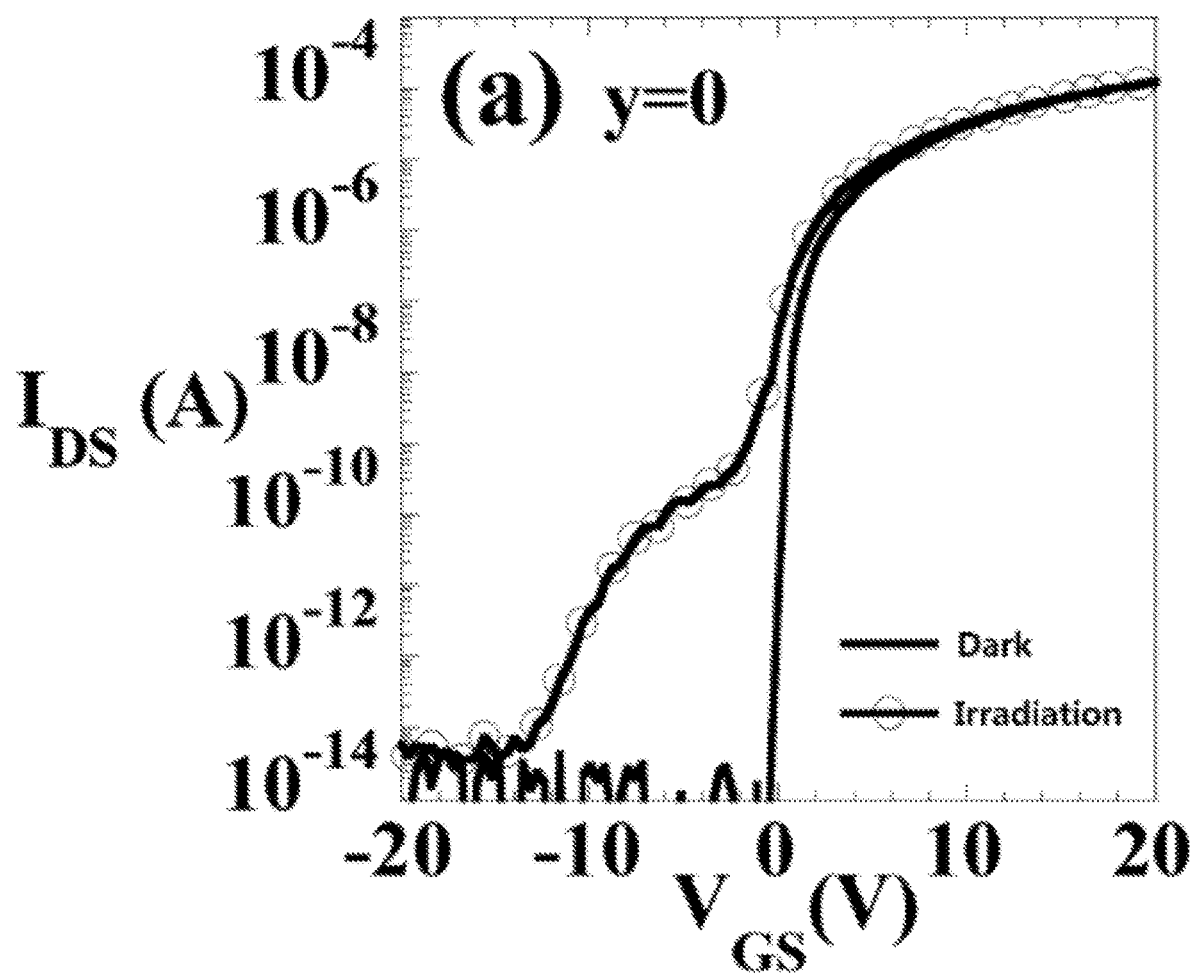
FIG. 6 is light-response curves of the thin-film transistors of example 2.
Figure 6B:
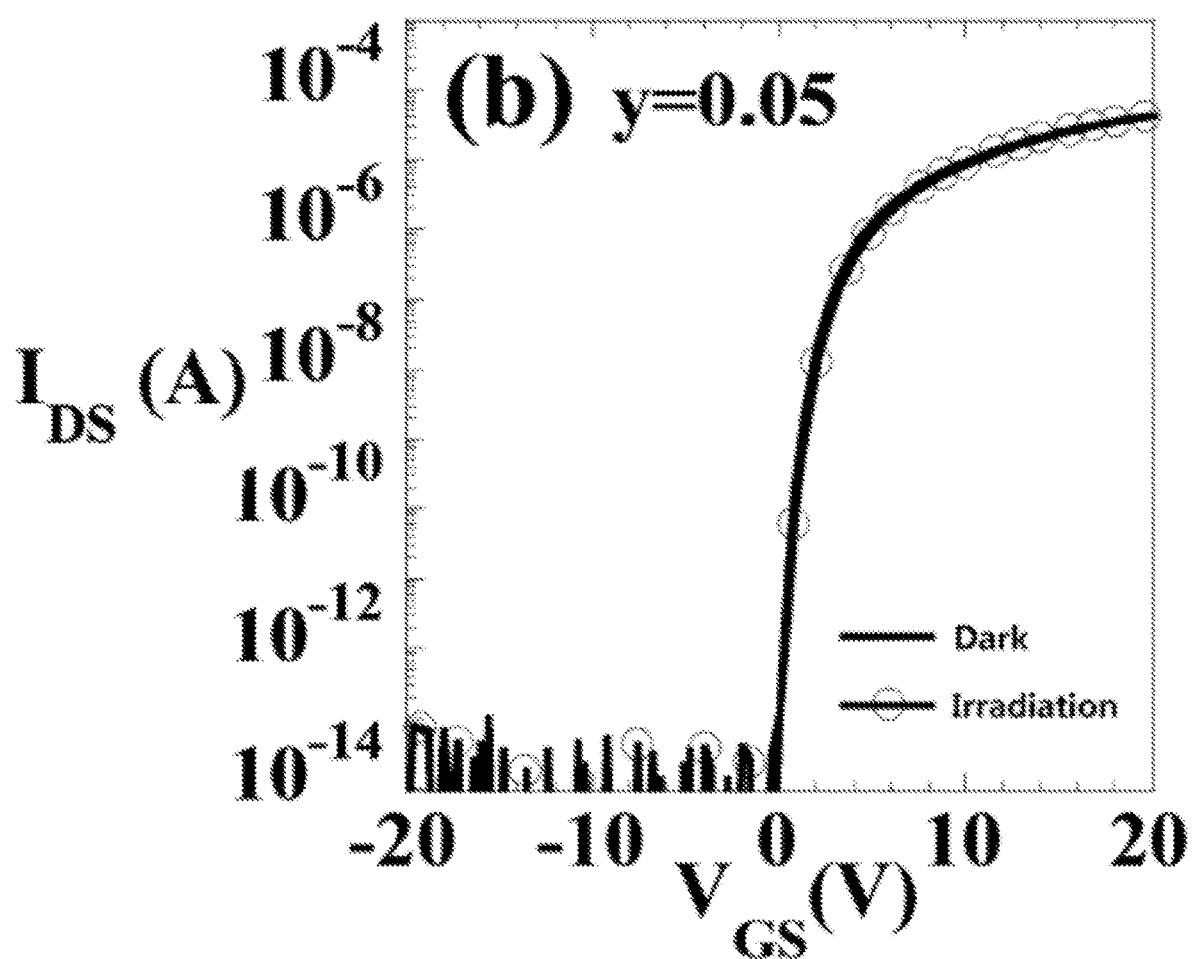
Figure 6C:
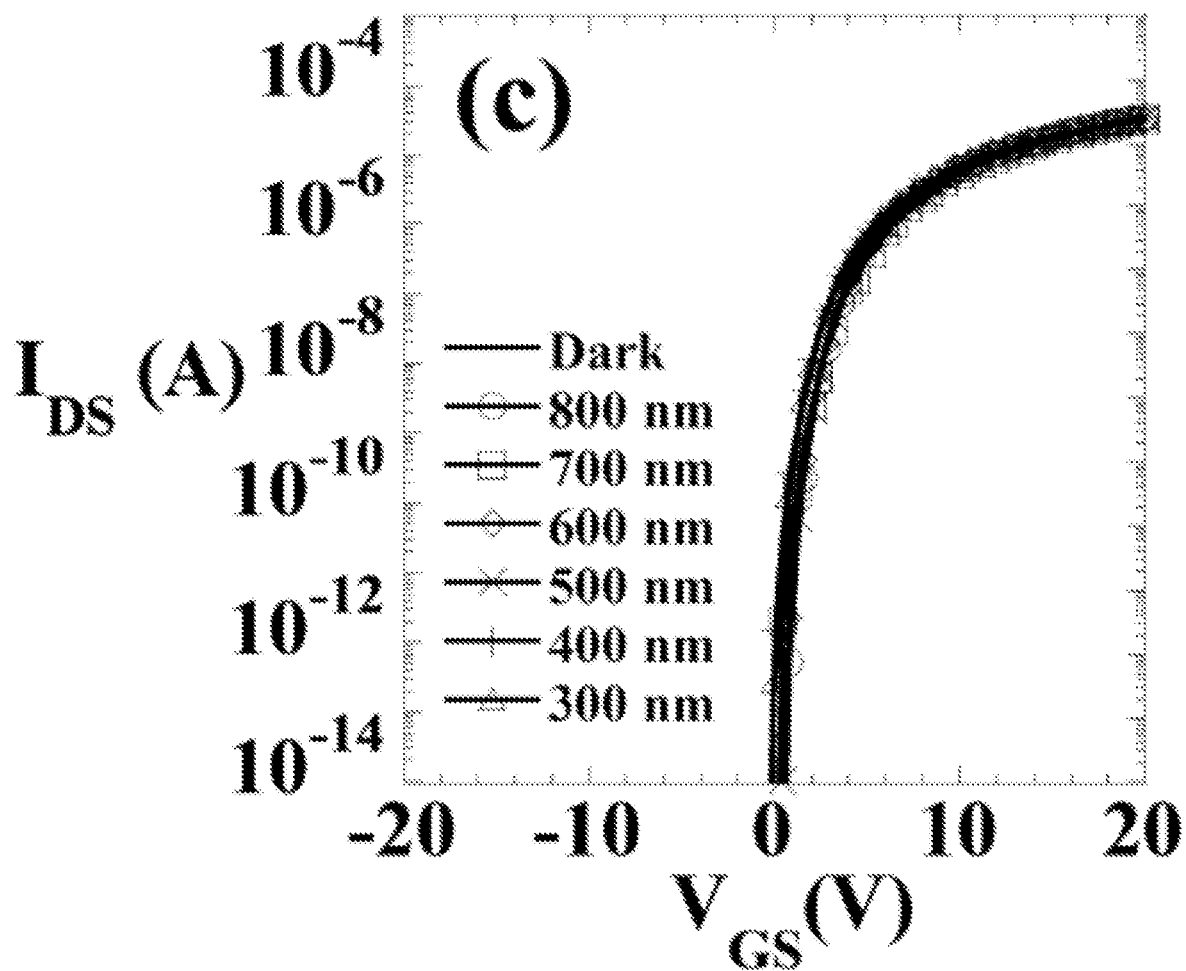

As an example, FIG. 6 shows a light-response curve of the thin-film transistors in example 2, FIG. 6 (a) and FIG. 6 (b) show the light-response curves of thin-film transistors corresponding to the y 0 and 0.05, respectively. As can be seen in FIG. 6, performance of the TFT devices without Pr doping degraded significantly under the LED illumination. However, the light-response is suppressed significantly with appropriate Tb doping, which means excellent light-induced stability and correspond to weak photo-current characteristics in Table 2.

In addition, to further understand the light-response characteristics, the TFTs with various monochromatic light illumination was also investigated. As can be seen in FIG. 6 (c), to the TFT with Tb doping (y=0.05), the negligible degradation in the sub-threshold regime is obtained even with the wavelengths shorter than 300 nm, which exhibit excellent light-induced stability and correspond to weak photo-current characteristics in Table 2.

The result of this example shows that it could improve the light-induced stability by doping a certain amount of terbium oxide into the indium-gallium-zinc-oxide base material.

Example 3

Example 3 presents an oxide semiconductor thin-film, the oxide semiconductor thin-film is made of dysprosium-doped indium-tin-zinc-oxide (Dy:ITZO) semiconductor material which is fabricated by doping dysprosium oxide as light stabilizer in indium-tin-zinc-oxide.

Example 3 presents a thin-film transistor, which is a back-Channel etch structure whose schematic structural diagram is shown as FIG. 5, comprising: a substrate 01, a gate electrode 02 positioned on the substrate 01, a gate insulator layer 03, the channel layer 04 covers on an upper surface of the gate insulator layer 03 and corresponds to the gate electrode 02, a source and drain electrode 05-1/05-2 that separately electrical connects to two sides of the channel layer 04, and a passivation layer 06.

The substrate 01 is made of flexible polyimide and covered with silicon oxide/silicon nitride layered structural buffer layer.

The gate electrode 02 is a Mo/Al/Mo layered structure with thickness of 50/200/50 nm to each layer, which is fabricated by magnetron sputtering of corresponding material subsequently.

The gate insulator layer 03 is a $Si_3N_4$/$SiO_2$ layered structure with thickness of 250/50 inn to each layer, which is fabricated by chemical vapor deposition (CVD). The $Si_3N_4$ layer electrical closes to the gate electrode 02 and the $SiO_2$ layer electrical faces to the channel layer 04.

In order to study the effects of dysprosium oxide concentration on the performance of device, the channel layer 04 is fabricated by co-sputtering of indium-tin-zinc-oxide (ITZO) ceramic target and dysprosium-doped indium-tin-zinc-oxide (Dy:ITZO) ceramic target; thin-films with different ratio are fabricated by regulating the power of each target.

In the indium-tin-zinc-oxide (ITZO) ceramic target, the ingredient mole ratio of $In_2O_3$:$SnO_2$:ZnO is 1:1:1 which marks In(2)Sn(1)Zn(1). In the dysprosium-doped indium-tin-zinc-oxide (Dy:ITZO) ceramic target, the ingredient mole ratio of $Y_2O_3$:In(2)Sn(1)Zn(1) is 0.30:0.70, which means the value of x is 0.70 and y is 0.30 in the formula $(MO)_x(RO)_y$.

It should be noted that, all channel layers in the tests 1-10 in this present example are deposited to 30 nm thick in Ar and $O_2$ mixture gas in volume ratio 7:3 at 0.5 Pa on 200° C. substrates. The thin-films are annealed at 350° C. in air for 30 min before patterning. The chemical compositions of the thin-films are analyzed by X-ray photoelectron spectroscopy and transmission electron microscopy; portions with trace concentration are conjectured base on sputtering power.

Both the source 05-1 and the drain 05-2 in the source and drain electrode are Mo/Al/Mo layered structure with thickness of 50/200/50 inn to each layer subsequently. They are patterned under etching of commercial available aluminic based etching solution. Since the channel layer material is etching resisted, the etching solution shows negligible damage to the channel layer and without etching residual.

The passivation layer 06 is a 300 nm $SiO_2$ layer which is fabricated by CVD.

The thin-film transistor in this present example can be an enclosed structure consisting of the substrate, the gate electrode, the gate insulator layer, the channel layer, the source and drain electrode and a passivation layer, or further comprising of a planarization layer, a reflective electrode, a pixel definite layer and so on, or even integrating with other devices.

The patterning process of the thin-films is carried on by lithography that combining with wet or dry etching.

The detailed parameters of the thin-films as well as the performance of the thin-films transistors consisted thereof are shown in Table 3. The photo-current characteristics are characterized by irradiating the channel layer of the thin-film transistors devices using commercial available LED lights, whose spectrograms are shown in FIG. 2 with the intensities of 10000 nits. The threshold voltage shifts were calculated by evaluating the transfer characteristics under light irradiation and without, which are used to evaluate the strength of photo-current characteristics of the devices. The larger the threshold voltage shift the stronger the photo-current characteristics, or otherwise the weaker.

Certainly, with the Dy concentration increasing the characteristics such as mobility will further degenerate and the photo-current characteristics will further decrease. An excess Dy concentration such as value of y excess 0.30 could result an obvious degeneration in mobility, which will largely restrict the application of those devices even, though they exhibit very weak photo-current characteristics. Since that, a suitable doping quantity should be considered carefully to balance mobility against photo-current characteristics.

Figure 7A:
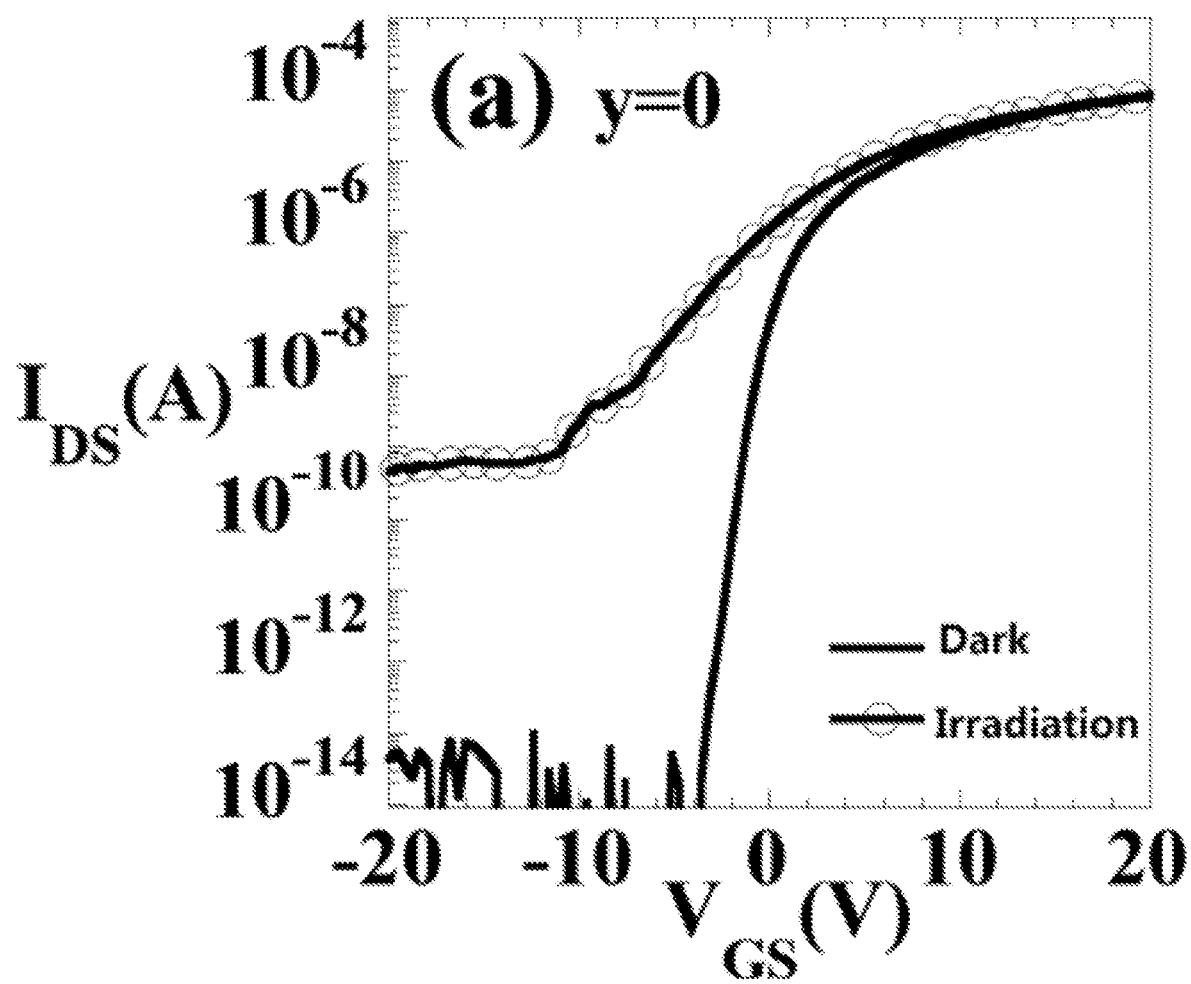
FIG. 7 is light-response curves of the thin-film transistors of example 3.
Figure 7B:
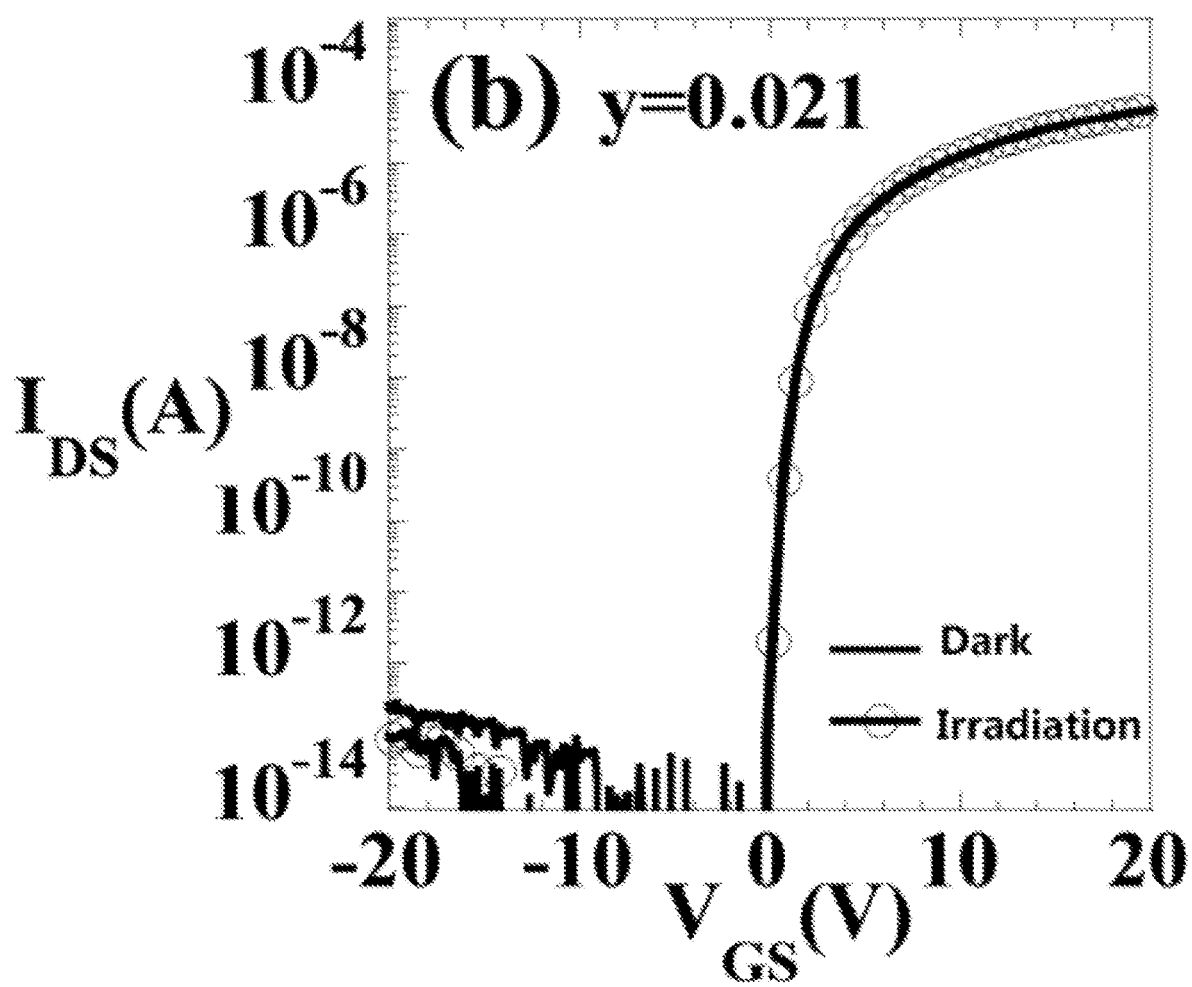
Figure 7C:
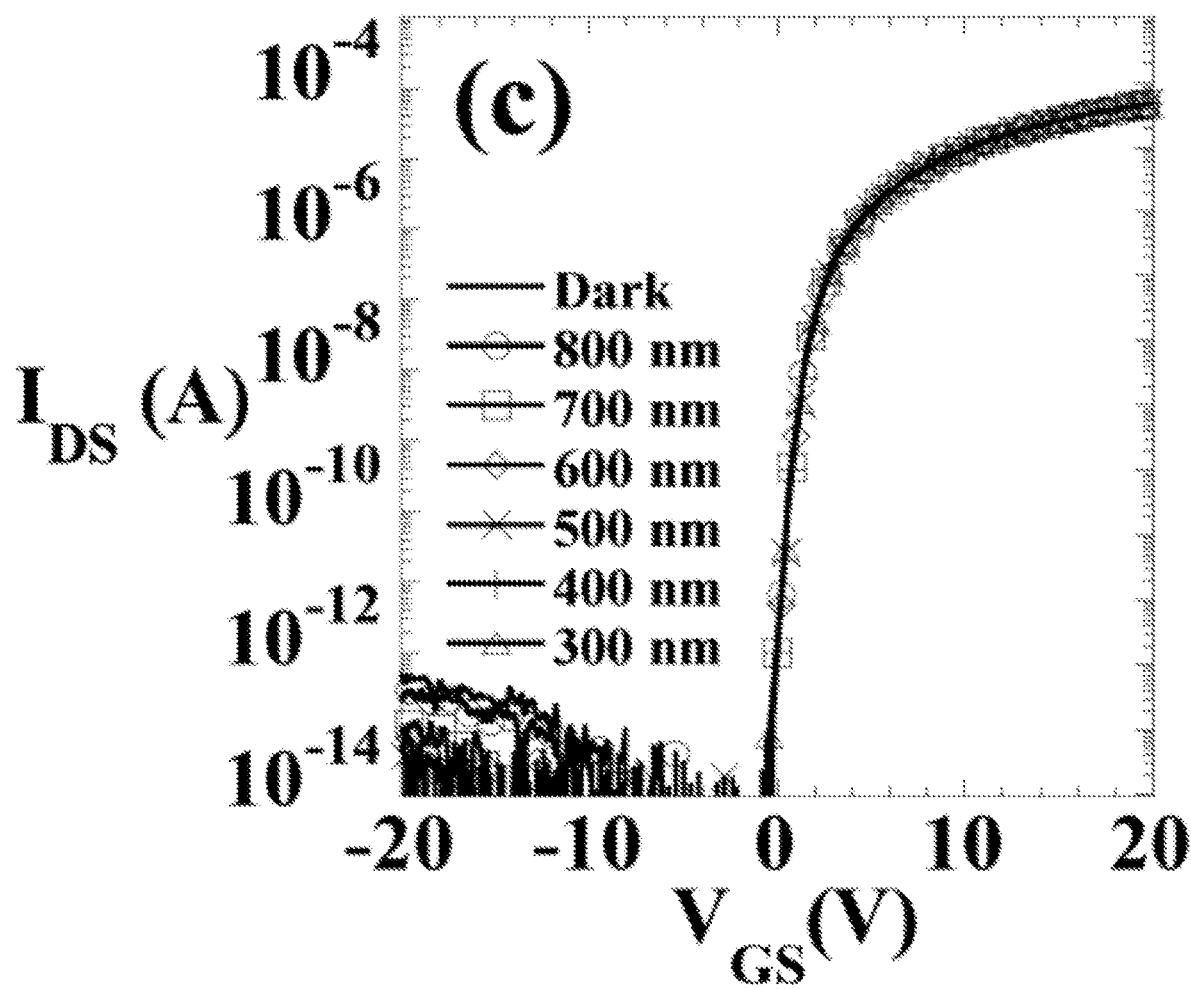

As an example, FIG. 7 shows a light-response curve of the thin-film transistors in Example 3, FIG. 7 (a) and FIG. 7 (b) show the light-response curves of the thin-film transistors corresponding to the y to 0 and 0.021, respectively. As can be seen from FIG. 7, performance of the TFT devices without Dy doping degraded significantly under the LED illumination. However, the light-response is suppressed significantly with appropriate Dy doping, which means excellent light-induced stability and corresponds to weak photo-current characteristics in Table 3.

In addition, to further understand of the light-response characteristic, the TFTs with various monochromatic light

TABLE 3

| | test | 1 | 2 | 3 | 4 | 5 | 6 | 7 | 8 | 9 | 10 |
|---|---|---|---|---|---|---|---|---|---|---|---|
| InSnZnO | mole ratio of In/Sn/Zn | | | | | 2:1:1 | | | | | |
| Dy | the value of y | 0 | 0.0001 | 0.001 | 0.013 | 0.021 | 0.053 | 0.12 | 0.16 | 0.20 | 0.30 |
| Channel layer deposition | Deposition method | | | | | sputtering | | | | | |
| | $O_2/(Ar + O_2)(\%)$ | | | | | 30 | | | | | |
| | Sputtering pressure(Pa) | | | | | 0.5 | | | | | |
| | Substrate temperature (° C.) | | | | | 200° C. | | | | | |
| channel layer treatment | Annealing | | | | | Air-350° C. | | | | | |
| Composition | Substrate | | | | | PI | | | | | |
| | Gate electrode | | | | | Mo/Al/Mo | | | | | |
| | Gate insulator layer | | | | | $SiO_2/Si_3N_4$ | | | | | |
| | Source and Drain electrode | | | | | Mo/Al/Mo | | | | | |
| | Passivation layer | | | | | $SiO_2$ | | | | | |
| After passivation layer | Annealing | | | | | Air-350° C. | | | | | |
| Performance | $V_{th}(V)$ [a] | −2.8 | −2.7 | −2.3 | −1.9 | −1.2 | −0.8 | 0.5 | 1.2 | 2.1 | 3.4 |
| | $\mu(cm^2V^{-1}s^{-1})$ [b] | 28.9 | 28.8 | 26.3 | 24.6 | 23.3 | 20.5 | 17.4 | 14.6 | 10.2 | 4.4 |
| | SS(V/decade) [c] | 0.12 | 0.12 | 0.12 | 0.13 | 0.14 | 0.17 | 0.19 | 0.23 | 0.27 | 0.36 |
| | $I_{on}/I_{off}$ | $10^9$ | $10^9$ | $10^9$ | $10^9$ | $10^9$ | $10^9$ | $10^9$ | $10^9$ | $10^8$ | $10^7$ |
| | Stability [d] | −− | − | + | ++ | ++ | ++ | ++ | ++ | ++ | ++ |
| | photo-current characteristics [e] | ++ | ++ | − | − | − | − | − | − | − | −− |

Note:
[a] threshold voltage;
[b] mobility;
[c] sub-threshold swing;
[d] −−, very poor; −, relatively poor; +, good; ++, excellent;
[e] ++, very strong; + relatively strong; − weak; −−, extremely weak As shown in Table 3, doping of Dy shows great effects on performance of the devices. Firstly, the device without Dy doping exhibited the highest mobility, lowest sub-threshold swing and negative threshold voltage but shows strong photo-current characteristic, which means the devices will suffer large characteristics change under irradiation, such as negative threshold voltage shift and seriously degradation of sub-threshold swing. However, the photo-current characteristics of the devices are obviously suppressed by doping a certain amount of dysprosium oxides.

illumination was also investigated. FIG. 7 (c) shows the monochromatic light-response of the TFTs with Dy doping (y=0.021), negligible degradation in the sub-threshold regime is found even with the wavelengths shorter than 300 nm, which exhibit excellent light-induced stability They also and correspond to the weak photo photo-current characteristics in Table 3.

The result of this example shows that it could improve the light-induced stability by doping a certain amount of dysprosium oxide into the indium-tin-zinc-oxide base material.

Example 4

Example 4 presents an oxide semiconductor thin-film, the oxide semiconductor thin-film is made of ytterbium-doped tin-zinc-oxide (Yb:ZTO) semiconductor material which is fabricated by doping ytterbium oxide as light stabilizer in tin-zinc-oxide semiconductor by solution-process.

Figure 8:
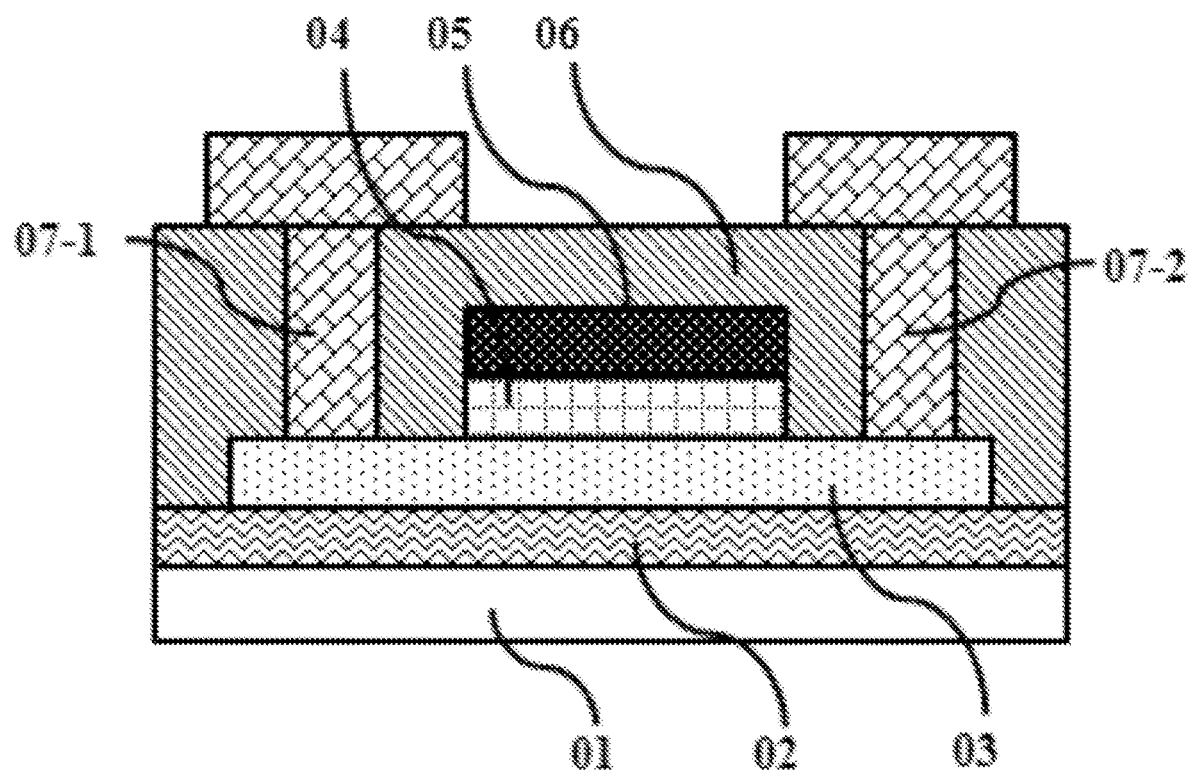
FIG. 8 is a schematic structural diagram of the thin-film transistor of example 4.

Example 4 presents a thin-film transistor, which is a top-gate self-alignment structure whose schematic structural diagram is shown in FIG. 8, comprising: a substrate 01, a buffer layer 02, a channel layer 03, a gate insulator layer 04 and a gate electrode 05 positioned on the channel layer 03, an interval layer 06 covers on the channel layer 03 and an upper surface of the gate electrode 05, a source and drain electrode 07-1/07-2 insert through the interval layer 06, the thin-film transistor employs a self-align structure that the source 07-1 and the drain 07-2 separately electrical connects to two sides of the channel layer 03.

The substrate 01 is made of rigid glass.

The buffer layer is $SiO_2$ layer which is fabricated by plasma enhanced chemical vapor deposition.

The material of channel layer 03 is ytterbium-doped tin-zinc-oxide and the thickness of the channel layer is 40 nm.

The gate insulator layer 04 is made of $SiO_2$ and its thickness is 200 nm. The gate electrode 05 is a Mo/Cu layered structure with thickness of 200:20 nm to each layer separately, which is fabricated by magnetron sputtering of corresponding metal subsequently.

The interval layer 06 is a $Si_3N_4/SiO_2$ layered structure with thickness of 200/100 nm to each layer separately.

Both the source 07-1 and the drain 07-2 in the source and drain electrode are Mo/Cu layered structure with thickness of 200/20 to each layer, which is fabricated by magnetron sputtering subsequently.

The thin-film transistor in this present example can be an enclosed structure consisting of the substrate, the channel layer, the gate insulating layer, the gate electrode, a spacer layer, a source and drain electrode, and may further include a passivation layer, a pixel defining layer and so on, or even integrating with other devices.

The patterning process of the thin-films is carried on by lithography that combining with wet or dry etching.

The detailed parameters of the thin-films as Well as the performance of the thin-films transistors consisted thereof are shown in Table 4. The photo-current characteristics are characterized by irradiating the channel layer of the thin-film transistors devices using commercial available LED lights, whose spectrograms are shown in FIG. 2 with the intensities of 10000 nits. The threshold voltage shifts were calculated by evaluating the transfer characteristics under light irradiation and without, which are used to evaluate the strength of photo-current characteristics of the devices. The larger the threshold voltage shift the stronger the photo-current characteristics, or otherwise the weaker:

TABLE 4

| | test | 1 | 2 | 3 | 4 | 5 | 6 | 7 | 8 | 9 | 10 |
|---|---|---|---|---|---|---|---|---|---|---|---|
| ZnSnO | mole ratio of Zn/Sn | | | | | 2:1 | | | | | |
| Yb | the value of y | 0 | 0.0001 | 0.001 | 0.01 | 0.02 | 0.05 | 0.10 | 0.15 | 0.20 | 0.30 |
| Channel layer deposition | Deposition method | | | | | solution process | | | | | |
| | Preheat temperature (° C.) | | | | | 120° C. | | | | | |
| Channel layer treatment | Annealing | | | | | 400° C. | | | | | |
| Composition | Substrate | | | | | rigid glass | | | | | |
| | Buffer layer | | | | | SiOx | | | | | |
| | Gate insulator layer | | | | | SiOx | | | | | |
| | gate electrode | | | | | Mo/Cu | | | | | |
| | Interval layer | | | | | $SiO_2/Si_3N_4$ | | | | | |
| | Source and Drain electrode | | | | | Mo/Cu | | | | | |
| After gate insulator layer | Annealing | | | | | Air-350° C. | | | | | |
| Performance | $V_{th}(V)$ [a] | -2.2 | -2.2 | -1.9 | -1.1 | 0.2 | 1.2 | 2.4 | 4.1 | 7.6 | 9.4 |
| | $\mu(cm^2V^{-1}s^{-1})$ [b] | 11.5 | 11.3 | 10.4 | 9.7 | 7.2 | 6.8 | 4.3 | 2.5 | 1.3 | 0.1 |
| | SS(V/decade) [c] | 0.12 | 0.12 | 0.13 | 0.13 | 0.15 | 0.16 | 0.19 | 0.21 | 0.28 | 0.46 |
| | $I_{on}/I_{off}$ | $10^8$ | $10^8$ | $10^8$ | $10^8$ | $10^8$ | $10^8$ | $10^7$ | $10^7$ | $10^7$ | $10^6$ |
| | Stability [d] | + | + | + | ++ | ++ | ++ | ++ | ++ | ++ | ++ |
| | photo-current characteristics [e] | ++ | ++ | + | − | − | − | − | − | − | −− |

Note:
[a] threshold voltage;
[b] mobility;
[c] sub-threshold swing;
[d] +, good; ++, excellent;
[e] ++, strong; +, relatively strong; −, weak; −−, extremely weak As shown in Table 4, doping of Yb shows great effects on performance of the devices. Firstly, the device without Yb doping exhibits the highest mobility, lowest sub-threshold swing and negative threshold voltage but show strong photo-current characteristic, which means the devices will suffer large characteristics change under irradiation, such as negative threshold voltage shift and seriously degradation of sub-threshold swing. However, the photo-current characteristics of the devices are obviously suppressed by doping, a certain amount of ytterbium oxides.

Certainly, with the Yb concentration increasing the characteristics such as mobility will further degenerate and the photo-current characteristics will further decrease. While an excess Yb concentration (value of y excess 0.30) could result an obvious degeneration in mobility, which will largely restrict the application of those devices even though they exhibit very weak photo-current characteristics. Since that, a suitable doping quantity should be considered carefully to balance mobility against photo-current characteristics.

Figure 9A:
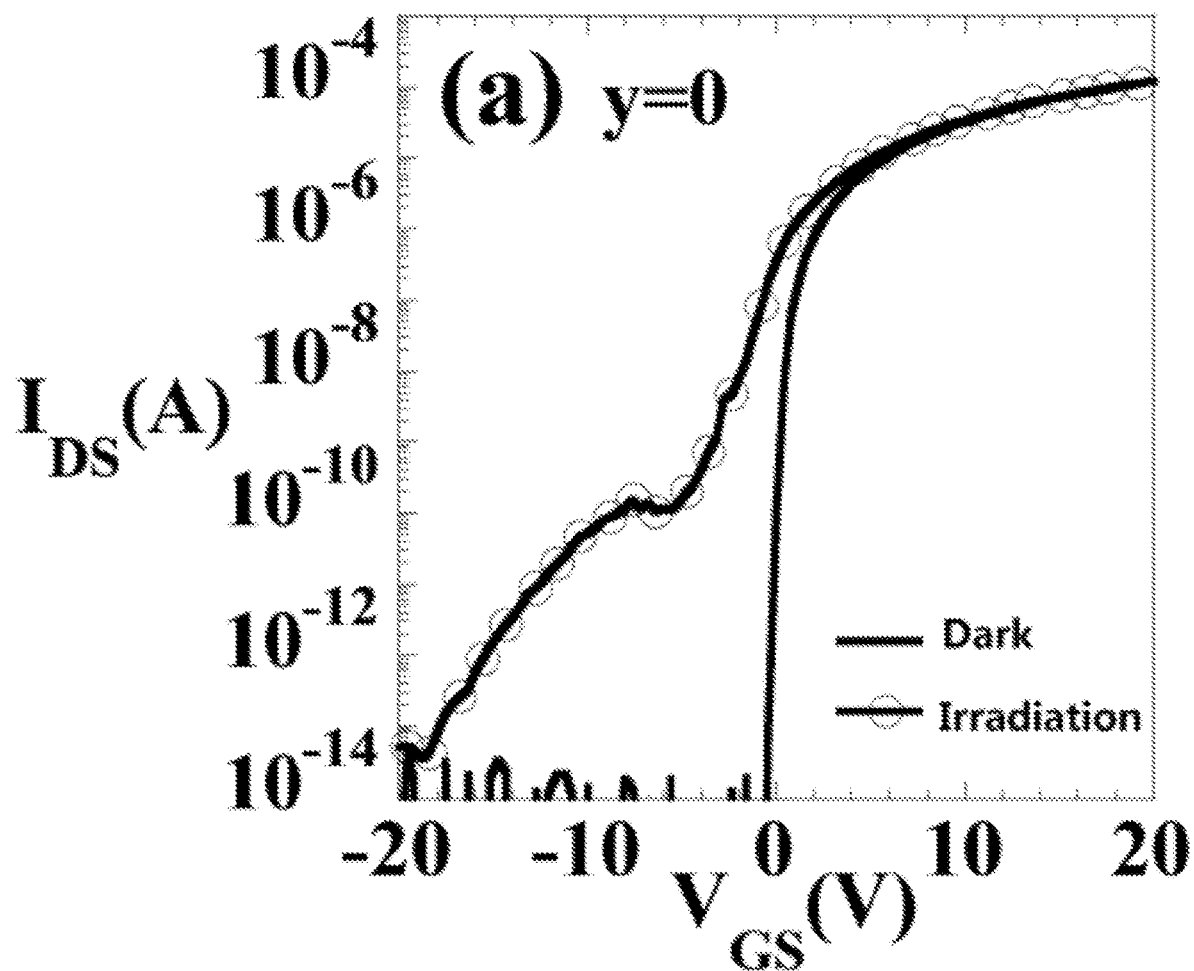
FIG. 9 is light-response curves of the thin-film transistors of example 4.
Figure 9B:
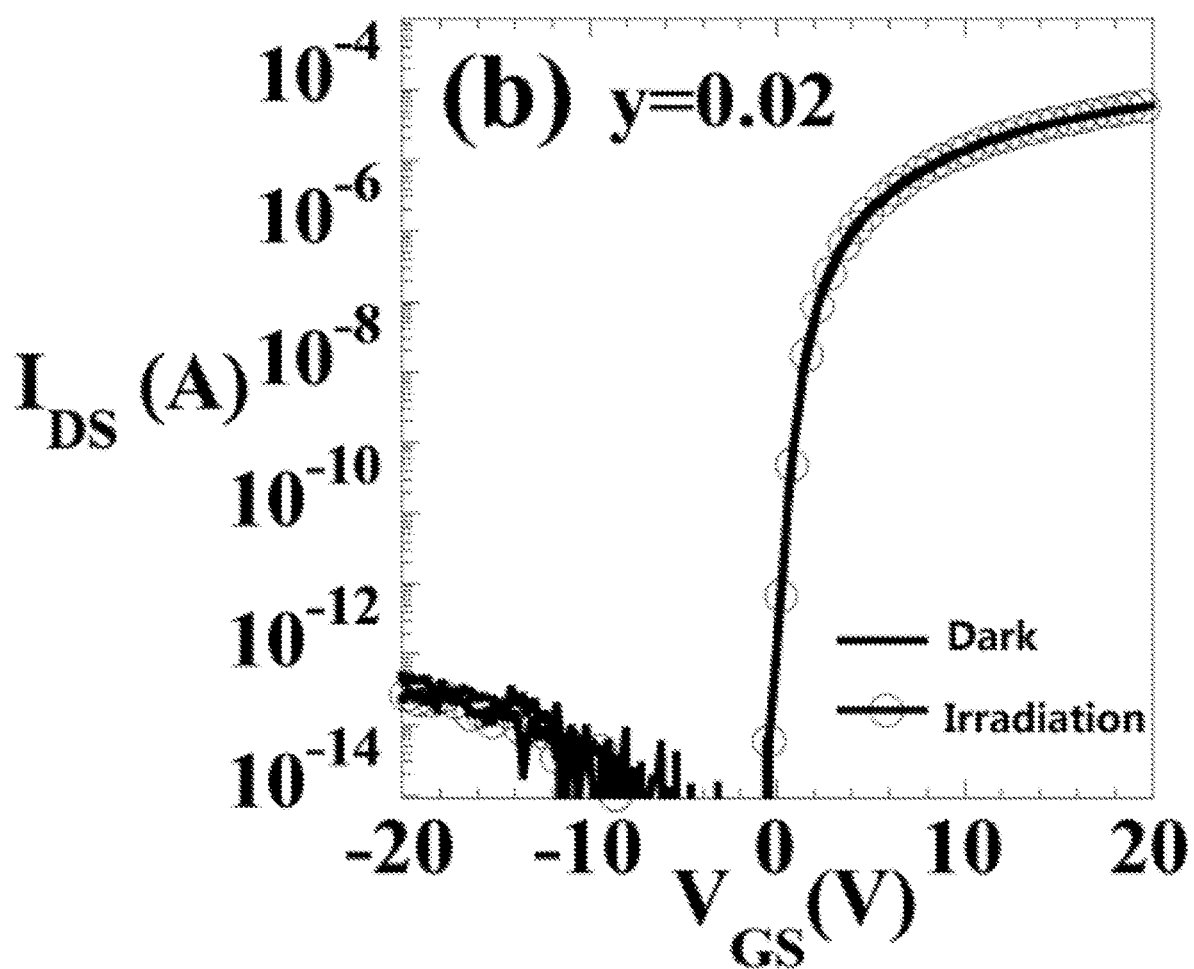
Figure 9C:
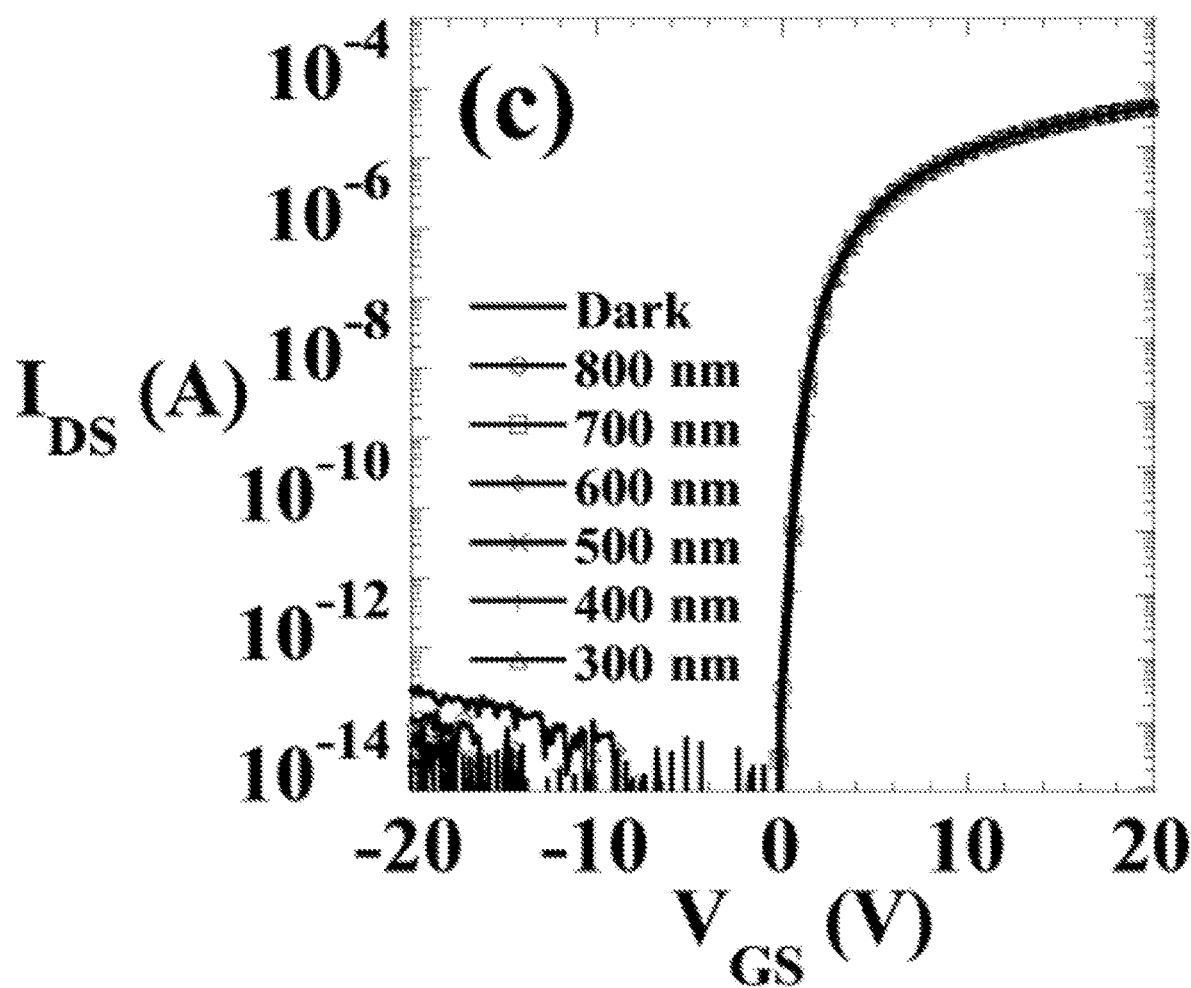

As an example, FIG. 9 shows light-response curves of the thin-film transistors in Example 4, FIG. 9 (a) and FIG. 9 (b) show the light-response curves of the thin-film transistors corresponding to the y to 0 and 0.02, respectively. As can be seen in FIG. 9, the performance of the TFT devices without Pr doping degraded significantly under the LED illumination. However, the light-response is suppressed significantly with appropriate Yb doping, which means excellent light-induced stability and corresponds to weak photo-current characteristics in Table 4.

In addition, to further understand of the light-response characteristics, the TFTs with various monochromatic light illuminations were also investigated. FIG. 9 (c) shows the monochromatic light-response of the TFTs with Yb doping (y=0.02). As for the TFT with Pr doping (y=0.02), negligible degradation in the sub-threshold regime is found even with the wavelengths shorter than 300 nm, which means excellent light-induced stability and corresponds to weak photo-current characteristics in Table 4.

The result of this example shows that it could improve the light-induced stability by doping a certain amount of ytterbium oxide into the tin-zinc-oxide base material.

Here are detailed descriptions of implements of each functional layer in the present application:

There is no special restriction of substrate in this present application, which means almost all the substrate well-known in this technical field will do. For example, some rigid substrate such as alkaline glass, alkaline-free glass, quartz glass or silicon substrate, or some flexible substrates such as polyimide (PI), polyethylene naphthalate (PEN), polyethylene terephthalate (PET), polyethylene (PE), polypropylene (PP), polystyrene (PS), polyethersulfone (PES) or foil and so on.

There is no special restriction of gate electrode material in this present application, which means almost all the gate electrode material well-known in this technical field will do. For example, some transparent conductive oxides such as ITO, AZO, GZO, IZO, ITZO, FTO and so on, or some metal such as Mo, Al, Cu, Ag, Ti, Au, Ta, Cr, Ni and so on or their alloy, or some metal and oxides layered material such as ITO/Ag/ITO, IZO/Ag/IZO and so on, or some composite conductive film fabricated from layered metal such as Mo/Al/Mo, Ti/Al/Ti and so on.

The fabrication of gate electrode could be carried out by deposition methods such as sputtering, electroplating, thermal evaporation and so on. The optimize method is sputtering, since the film fabricated thereby exhibits excellent adhesion to the substrate, uniformity and could be large area.

Here, the structure of the gate electrode should be considered carefully depends on the desired technical parameters. For example, the transparent electrode is required at transparent display, which means the single layer 110 or the ITO/Ag/ITO will do. In addition, high temperature resisted metal alloy will be applied when there are high temperature processes at some special application.

There is no special restriction of the gate insulator layer material, which means almost all the well-known material in this technical field will do. Such as $SiO_2$, $Si_3N_4$, $Al_2O_3$, $Ta_2O_5$, $HfO_2$ and $Y_2O_3$, and polymer organic film layer and so on.

It should be noted that, the composition of the gate insulating layer material may be inconsistent with the theoretical stoichiometric ratio. The gate insulator layer could be multi-layered structure, which not only exhibits excellent insulativity but also improves interface characteristics between the channel layer and gate insulator layer. In addition, the fabricate process of the gate insulator layer could be carried out by physical vapor deposition, chemical vapor deposition, atomic layer deposition, laser deposition, anodization or solution process and so on.

The channel layer in this present application is made of metal oxide semiconductor material represent by formula $(MO)_x(RO)_y$, which is fabricated by doping Rare-earth Oxides as light stabilizer in Metal Oxide semiconductor, in where, $0.8 \leq x < 1$, $0.0001 \leq y \leq 0.2$, $x+y=1$;

the M in the metal oxide semiconductor is one element selected from In, Zn, Ga, Sn, Si, Al, Mg, Zr, Hf or Ta, or any arbitrary combination of two or more;

the R in the rare-earth oxide is one element selected from Pr, Tb, Dy, Yb, or any arbitrary combination of two or more. The rare-earth oxide could be praseodymium oxide, terbium oxide, dysprosium oxide or ytterbium oxide.

The thickness of the metal oxide semiconductor film is 5 nm to 100 nm. The carrier concentration of the metal oxide semiconductor film is small than $5 \times 10^{19}$ $cm^{-3}$.

It should be noted that, the devices exhibit a limited performance improvement at a very low rare-earth element concentration, such as the value of y is lower than 0.0001, While the overall performance will also be affected at a higher concentration such as the value of y excess 0.2, which including a sharp decay of mobility, an Obviously increase of sub-threshold swing region, and a decrease of current switching ratio and so on.

The etching solution in the wet etching process including phosphoric acid, a mixture of nitric acid and glacial acetic acid or a mixture based on hydrogen peroxide. The etch rate of the metal oxide semiconductor material in the hydrogen peroxide based etching solution is less than 1 nm/min. For dry etching, a plasma etching process may be selected, and the etching gas may be selected from a chlorine-based or fluorine-based gas.

In the vacuum magnetron sputtering process that fabricating the metal oxide semiconductor material, single target sputtering or co-sputtering will do, preferably single target sputtering.

The film which is fabricated by single target sputtering is more reproducible, more stable and its microstructure is easier to control: while the film which is fabricated by co-sputtering, the sputtered particles will be more affected by interferences during the recombination process.

During vacuum sputtering deposition, the power source may be selected from radio frequency (RF) sputtering, direct current (DC) sputtering or alternative current (AC) sputtering, preferably alternating current sputtering in the industry.

During sputtering deposition, the sputtering pressure is optionally 0.1 Pa to 10 Pa, preferably 0.3 Pa to 0.7 Pa, more preferably 0.5 Pa, for it hard to maintain glow sputtering at a lower pressure, and the scattering of the sputtered particles during the deposition to the substrate will significantly increase, the energy loss increase, the kinetic energy reduce after reaching the substrate, and the defects of the thin-films consisted thereof will increase, which means the performances of devices are seriously affected at an excessive sputtering pressure.

During the sputtering deposition process, the oxygen partial pressure is 0 to 1 Pa, preferably 0.001 to 0.5 Pa, preferably 0.03 to 0.42 Pa, and more preferably 0.05 to 0.15 Pa.

In general, during the sputtering process that fabricating the oxide semiconductor, the oxygen partial pressure shows a direct effect on the carrier concentration of the film, and oxygen vacancy-related defects may be introduced. Too low oxygen partial pressure may cause serious mismatch of oxygen in the film and increase carrier concentration, while excessive oxygen vacancies will cause weak bonds and degrade the reliability of the devices.

The substrate temperature during sputtering deposition is preferably room temperature to 400° C., preferably 200 to 300° C.

During the deposition of the channel layer, a certain substrate temperature can effectively improve the bonding mode of the sputtered particles after reaching the substrate, reducing the existence of weak bonds, and improve the stability of the device. Of course, this effect can also be achieved by subsequent annealing processes and the like.

The thickness of the channel layer is 2 to 100 nm, preferably 5 to 50 nm, and more preferably 20 to 40 nm.

There is no special restriction of the source and drain electrode materials in this present application, which means it can be selected arbitrarily from materials well-known in this technical field affecting the realization of various desired structural devices. For example, some transparent conductive oxides such as ITO, AZO, GZO, IZO ITZO, FTO and so on, or some metal such as Mo, Al, Cu, Ag, Ti, Au, Ta, Cr, Ni and so on or their alloy, or some metal and oxides layered material such as ITO/Ag/ITO, IZO/Ag/IZO and so on, or some composite conductive film fabricated from layered metal such as Mo/Al/Mo, Ti/Al/Ti and so on.

The fabricate process of the source and drain electrode film may be a sputtering method, thermal evaporation, or other deposition method. The sputtering deposition is the preferably method because the film fabricated thereby exhibits good adhesion with the substrate, excellent uniformity, and can be large area.

It should be particularly noted that in fabricate process of the back-channel etch structural devices, a suitable etching selectivity ratio of the source and drain electrodes and the channel layer should be carefully considered or otherwise the device fabrication cannot be successfully achieved. The etching solution in the wet etching process in the example of the present invention is based on a conventional etching solution for metal in the industry; for example, a hydrogen peroxide based etching solution, for the reason that the metal oxide semiconductor material of the present application can effectively resist the wetness, which shows a high etching selectivity ratio with the metal such as molybdenum, molybdenum alloy, molybdenum/aluminum/molybdenum, etc. The metal oxide semiconductor material will exhibit negligible effects of the etching solution, and the device fabricated thereof shows excellent performance and high stability. In addition, the dry etching in the example of the present invention is based on an industrial conventional etching gas, such as a chlorine-based gas, a fluorine-based gas, etc., which shows limited effect on the oxide semiconductor layer of the present application, and the device fabricated thereof shows excellent performance and high stability.

There is no special restriction of the passivation layer materials in this present application, which means it can be arbitrarily selected from materials well known in the art such as silicon oxide, silicon nitride, aluminum oxide, hafnium oxide, tantalum oxide, hafnium oxide, and a polymer organic film layer and so on.

The composition of the passivation layer may be inconsistent with the theoretical stoichiometric ratio.

In addition, the passivation layer could be multi-layered passivation layer, which not only exhibits excellent insulativity but also improves interface characteristics between the channel layer and the passivation layer. In addition, the fabricate process of the passivation layer could be carried out by physical vapor deposition, chemical vapor deposition, atomic layer deposition, laser deposition, anodization or solution process and so on.

Here is a further description of the treatment process during the fabrication of the thin film transistors in the examples of the present application.

Relatively speaking, the deposition rate of the thin-film which is fabricated by sputtering is faster because of the participation of high energy plasma. The thin-film does not have enough time to perform a relaxation process during deposition, which causes a certain proportion of dislocation and stress remained in the film. That requires a post heat annealing treatment to continue to achieve the desired relative steady state and improve the properties of the film.

In the example of the present application, the annealing process is commonly employed after deposition of the channel layer or after deposition of the passivation layer. For one thing, the annealing treatment after deposition of the channel layer can effectively improve the in-situ defects and improve the ability to resist damage in subsequent processes. For another thing, during subsequent deposition of the passivation layer an "activation" process may be required due to the participation of the plasma and the modification of the reactive groups, to further eliminate the effects of interface states and some donor doping.

In addition, in the implement of the present invention, the method of treatment is not restricted to heat treatment, but also suitable to plasma processing interface, such as interface between a gate insulating layer and semiconductor, or interface between a channel layer and passivation layer interface, etc. Through the treatment mentioned above, the performance of the device can be effectively improved, and the stability of the device can be improved.

The embodiment of the present application described above is just a preferred embodiment, it is not just limited to the above embodiment, any other change, like modifications, substitutions, combinations, simplification, made in the present application does not depart from the spirit and principles, shall be equivalent replacement and included within the scope of the present application.

What is claimed is:

1. An oxide semiconductor thin-film, wherein, the oxide semiconductor thin-film is fabricated from a $(MO)_x(RO)_y$ semiconductor material by doping an amount of rare-earth oxide (RO) as a light stabilizer to a metal oxide (MO) semiconductor, wherein, $0.8 \leq x < 1$, $0.012 \leq y \leq 0.2$, $x+y=1$;

the M in the metal oxide semiconductor consists of one or more elements selected from the group consisting of In, Zn, Ga, Sn, and combinations thereof;

the R in the rare-earth oxide is at least one element selected from the group consisting of Pr, Tb, Dy, and Yb.

2. The oxide semiconductor thin-film of claim 1, wherein, the M in the metal oxide semiconductor is a combination of Zn with one or two elements selected from Sn, In and Ga.

3. The oxide semiconductor thin-film of claim 2, wherein, the metal oxide semiconductor is one selected from the group consisting of indium-zinc-oxide, indium-gallium-zinc-oxide, indium-tin-zinc-oxide and tin-zinc-oxide.

4. The oxide semiconductor thin-film of claim 3, wherein, ingredient mole ratio of $In_2O_3$:ZnO is 2:1 in the indium-zinc-oxide.

5. The oxide semiconductor thin-film of claim 3, wherein, ingredient mole ratio of $In_2O_3$:$Ga_2O_3$:ZnO is 2:1:2 in the indium-gallium-zinc-oxide.

6. The oxide semiconductor thin-film of claim 3, wherein, ingredient mole ratio of $In_2O_3$:$SnO_2$:ZnO is 1:1:1 in the indium-tin-zinc-oxide.

7. The oxide semiconductor thin-film of claim 3, wherein, ingredient mole ratio of ZnO:$SnO_2$ is 2:1 in the tin-zinc-oxide.

8. The oxide semiconductor thin-film of claim 1, wherein, the $(MO)_x(RO)_y$ semiconductor material is one selected from the group consisting of praseodymium-doped indium-zinc-oxide, terbium-doped indium-gallium-zinc-oxide, dysprosium-doped indium-tin-zinc-oxide, and ytterbium-doped tin-zinc-oxide.

9. The oxide semiconductor thin-film of claim 1, wherein, the oxide semiconductor thin-film is fabricated by sputtering in Ar and $O_2$ mixture gas with an oxygen volume ratio at 0.1 to 0.6.

10. The oxide semiconductor thin-film of claim 1, wherein, the oxide semiconductor thin-film is fabricated by sputtering in Ar and $O_2$ mixture gas with an oxygen volume ratio at 0.2 to 0.3.

11. The oxide semiconductor thin-film of claim 1, wherein, the oxide semiconductor thin-film is fabricated by a solution process.

12. A thin-film transistor, comprising a channel layer consisted by an oxide semiconductor thin-film, wherein,
the oxide semiconductor thin-film is fabricated from a $(MO)_x(RO)_y$ semiconductor material by doping an amount of rare-earth oxide (RO) as a light stabilizer to a metal oxide (MO) semiconductor, wherein, $0.8 \leq x < 1$, $0.012 \leq y \leq 0.2$, $x+y=1$;
the M in the metal oxide semiconductor consists of one or more elements selected from In, Zn, Ga, Sn, and combinations thereof;
the R in the rare-earth oxide is at least one element selected from the group consisting of Pr, Tb, Dy, and Yb.

13. The thin-film transistor of claim 12, further comprising: a substrate, a gate electrode, a gate insulator layer, an etch-stop layer, a source and drain electrode; wherein, the thin-film transistor employs an etch-stop structure.

14. The thin-film transistor of claim 12, further comprising: a substrate, a gate electrode, a gate insulator layer, a source and drain electrode; wherein, the thin-film transistor employs a back-channel etch structure.

15. The thin-film transistor of claim 14, wherein, the source and drain electrode is patterned under etchant of hydrogen peroxide based etching solution or aluminic based etching solution.

16. The thin-film transistor of claim 12, further comprising: a substrate, a buffer layer, a gate insulator layer, a gate electrode, an interval layer, a source and drain electrode; wherein, the thin-film transistor employs a top-gate self-alignment structure.

17. The thin-film transistor of claim 16, wherein, the substrate is a flexible substrate made from polyimide, polyethylene naphthalate, polyethylene terephthalate, polyethylene, polypropylene, polystyrene, or polyethersulfone.

18. The oxide semiconductor thin-film of claim 1, having an indirect band-gap.

19. The thin-film transistor of claim 12, wherein the oxide semiconductor thin-film has an indirect band-gap.

* * * * *